United States Patent
Yokomori et al.

(10) Patent No.: US 6,769,855 B2
(45) Date of Patent: Aug. 3, 2004

(54) SUBSTRATE PROCESSING APPARATUS AND SUBSTRATE PROCESSING METHOD

(75) Inventors: Masayuki Yokomori, Tosu (JP); Osamu Kuroda, Tosu (JP)

(73) Assignee: Tokyo Electron Limited, Tokyo (JP)

(*) Notice: Subject to any disclaimer, the term of this patent is extended or adjusted under 35 U.S.C. 154(b) by 39 days.

(21) Appl. No.: 10/032,528

(22) Filed: Dec. 27, 2001

(65) Prior Publication Data

US 2002/0081181 A1 Jun. 27, 2002

(30) Foreign Application Priority Data

Dec. 27, 2000 (JP) ........................................ 2000-398476

(51) Int. Cl.[7] ............................................. B65G 65/00
(52) U.S. Cl. .................................. 414/416.02; 414/938
(58) Field of Search ........................... 414/404, 416.02, 414/419.08, 938

(56) References Cited

U.S. PATENT DOCUMENTS

| | | | | |
|---|---|---|---|---|
| 4,611,966 A | * | 9/1986 | Johnson ...................... | 414/287 |
| 5,501,568 A | * | 3/1996 | Ono ............................ | 414/417 |
| 5,692,869 A | * | 12/1997 | Kumagai .................... | 414/404 |
| 5,730,162 A | * | 3/1998 | Shindo et al. ............... | 134/66 |
| 5,788,448 A | | 8/1998 | Wakamori et al. | |
| 5,976,198 A | * | 11/1999 | Suhara et al. .............. | 29/25.01 |
| 6,345,947 B1 | * | 2/2002 | Egashira ................... | 414/225.01 |
| 6,368,040 B1 | * | 4/2002 | Yamasaki et al. .......... | 414/222 |

FOREIGN PATENT DOCUMENTS

| | | |
|---|---|---|
| DE | 3909669 | 10/1989 |
| DE | 19921072 | 11/2000 |
| DE | 10038168 | 2/2002 |
| EP | 1146548 | 10/2001 |
| JP | 2634350 B2 | 4/1997 |

* cited by examiner

*Primary Examiner*—Thomas J. Brahan
(74) *Attorney, Agent, or Firm*—Morrison & Foerster LLP

(57) ABSTRACT

A substrate processing apparatus (1) includes a wafer loading/unloading and arraying part (14) to remove substrates W from a container (C) where a plurality of unprocessed substrates W to be processed are accommodated at regular intervals, substrate arraying part (51a, 51b, 60) for arranging the substrates W having been removed from two containers (C) at the loading/unloading and arraying part (14) at pitches half the pitch to arrange the substrates in the container (C), a processing part (4) for applying a designated process on the substrates (W), a transfer mechanism (17) for transporting the substrates (W) arranged by the substrate array part (51a, 51b, 60) to the processing part (4) and a stand-by part (75) to allow the substrates arranged by the substrate array parts to stand in readiness temporarily.

15 Claims, 20 Drawing Sheets

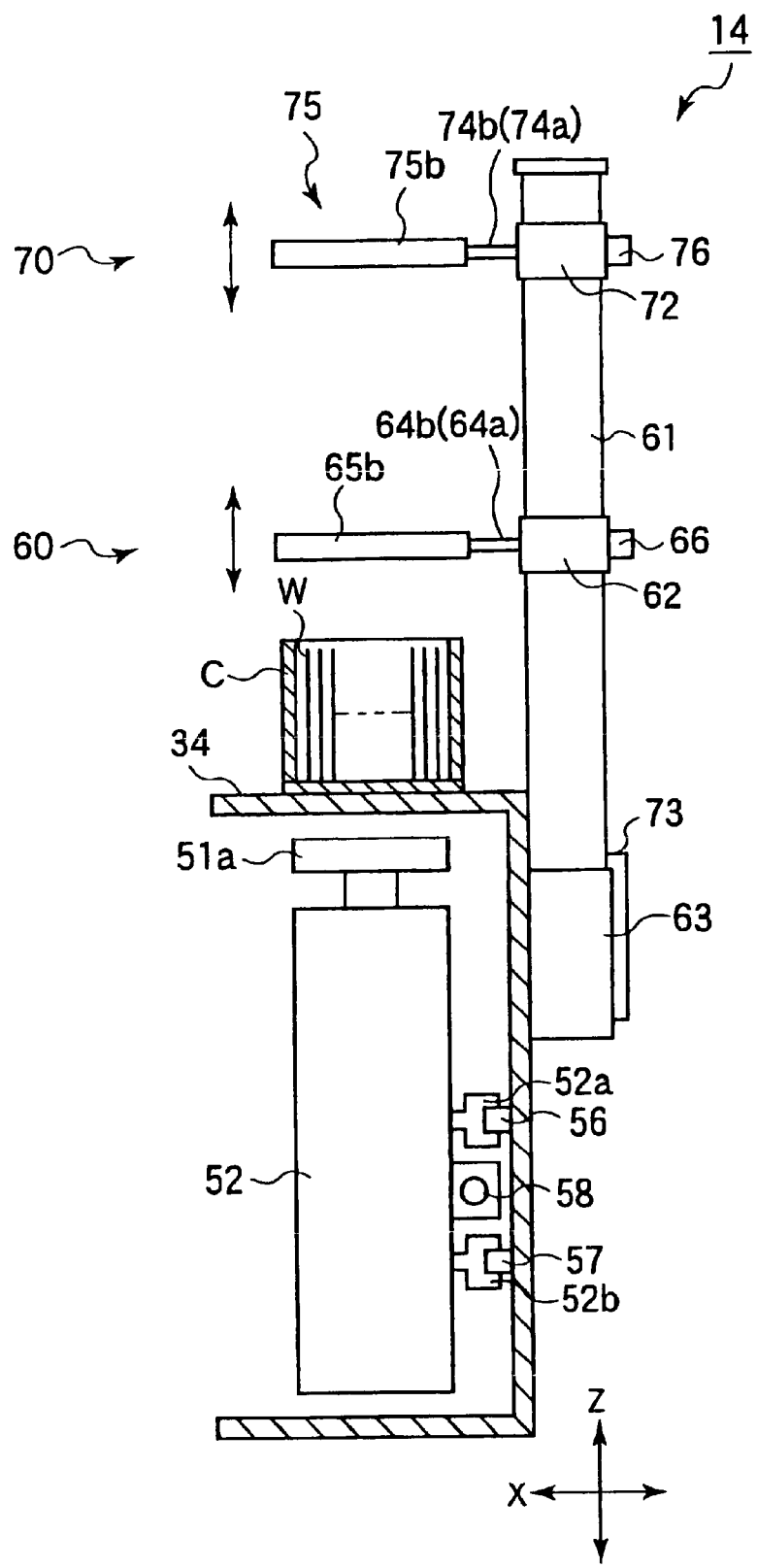
F I G. 7

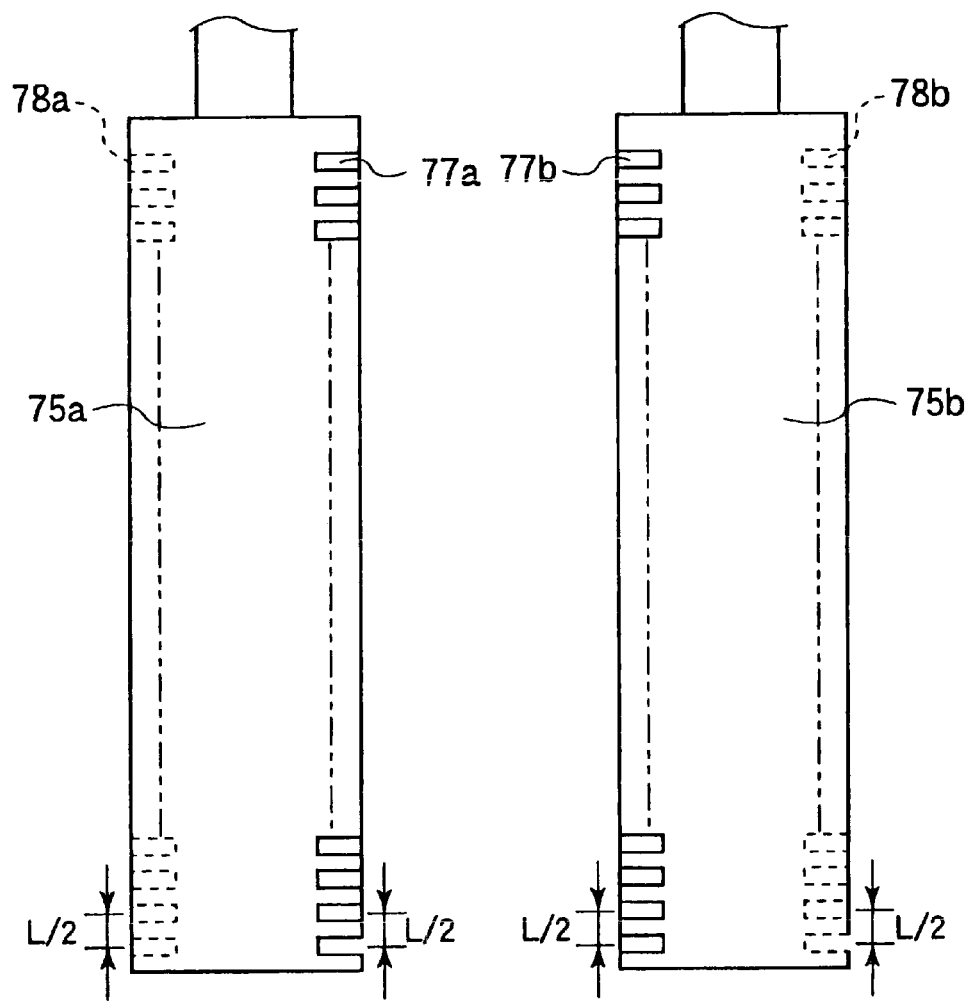
F I G. 10

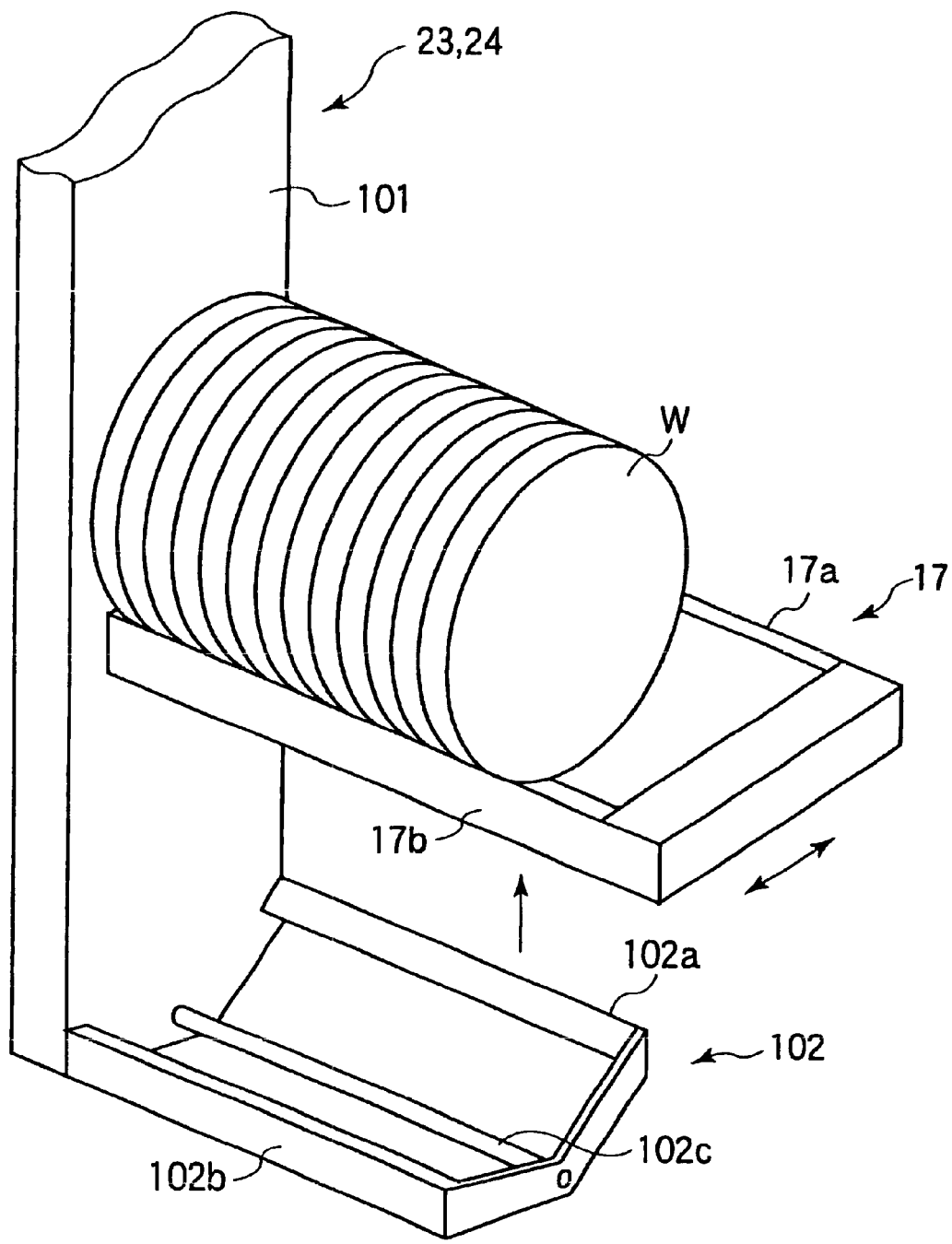
F I G. 14

SUBSTRATE PROCESSING APPARATUS AND SUBSTRATE PROCESSING METHOD

BACKGROUND OF THE INVENTION

1. Technical Field of the Invention

This invention relates to substrate processing apparatus and method for applying a designated treatment on substrates, for example, semiconductor wafers.

2. Description of the Related Art

Cleaning apparatuses of wet type are widely used in the semiconductor-devices manufacturing process. The wet-type cleaning apparatus applies designated treatments on the semiconductor wafers by using processing liquids, such as chemical liquids or pure water, in order to remove various contamination, for example, particles, organic pollutant, metallic impurities, etc., from the semiconductor wafers.

In such cleaning apparatus, the wafers contained in one or more carrier are removed therefrom and collectively held by a wafer holing arm, and then are submerged in a processing liquid stored in a process bath, in views of miniaturization of the cleaning bath and improvement in throughput. Such cleaning method is called "carrier-less" method, which is widely used in recent years.

In the carrier-less method, the wafers removed from two carriers are handled by the wafer holding arm at one time, for improving throughput. The wafers held by the wafer holding arm are spaced at regular intervals, which are half of the size of the intervals that exist when the wafers are held in the wafer carriers, in order to shorten the whole length of the row of the wafers for saving spaces in the apparatus.

In this method, which is disclosed in Japanese Patent No. 2634350, first and second carriers each containing (N) pieces of wafers (N: number of wafers) are conveyed from the carrier loading/unloading section of the cleaning apparatus to the wafer loading/unloading section. In the wafer loading/unloading section, the wafers are removed from the first and second carriers. Then, the pitch changer, which is provided at the wafer loading/unloading section, inserts each of the wafers of a second group, which are removed from the second carrier, into the spaces between adjacent wafers of a first group, which are removed from the first carrier. Thereupon, (2N) pieces of wafers are arranged in a row and spaced at regular intervals, which are half of the size of the intervals that exist when the wafers are held in the first and second wafer carriers. The wafers thus arranged are held by the wafer holding arm, and conveyed to the cleaning section of the apparatus. After completion of the cleaning process, the cleaned wafers returned to the pitch changer to re-divide into the first and the second groups. The divided wafers are accommodated in the first and second carriers, and are conveyed to the carrier loading/unloading section.

In the apparatus disclosed in Japanese Patent No. 2634350, if the cleaned wafers and the not-cleaned wafers contained in the carriers reach to the wafer loading/unloading section at the same timing, one of the wafers (not-cleaned wafers) must stand-by near the wafer loading/unloading section, because the wafer loading/unloading section cannot handle the cleaned wafers and the not-cleaned wafers at one time. This adversary affects the throughput of the apparatus.

SUMMARY OF THE INVENTION

The present invention has been made to solve the aforesaid problems, and it is therefore an object of the present invention to provide substrate processing apparatus and method that can shortened a stand-by period, improving the throughput of the apparatus.

In order to attain the above objectives, according to the first aspect of the present invention, there is provided a substrate processing apparatus including: a container loading/unloading part for loading a container containing a plurality of substrates before processed and for unloading a container containing a plurality of substrates after processed; a processing part for applying a treatment on the substrates, which have been removed from the container; a substrate transporting part provided for transportation of the substrates between the container loading/unloading part and the processing part; and a stand-by part for temporarily storing the substrate, which have been removed from the container and are subjected to the transportation in the substrate transporting part.

According to the second aspect of the present invention, there is also provided a substrate processing apparatus including: a container loading/unloading part for loading a container containing a plurality of substrates before processed and for unloading a container containing a plurality of substrates after processed; a processing part for applying a treatment on the substrates, which have been removed from the container; a substrate arraying part, disposed between the container loading/unloading part and the processing part, for changing an arraying condition of the substrates between a first arraying condition which the substrates must be set in at the container loading/unloading part and a second arraying condition which the substrates must be set in at the processing part; a first transfer mechanism for conveying the substrates in the first arraying condition between the container loading/unloading part and the substrate arraying part; a second transfer mechanism for conveying the substrates in the second arraying condition between the substrate arraying part and the processing part; and a stand-by part for temporarily storing the substrate, which have been removed from the container and changed in the arraying condition thereof.

According to the third aspect of the present invention, there is also provided a substrate processing apparatus including: a substrate removing part for removing a plurality of substrates, to be processed, from a container, which contains the substrates spaced at regular intervals; a substrate arraying part for arranging the substrates, which have been removed from two containers, so that the substrates are spaced at regular intervals, which are half of the size of the intervals that exist when the substrates are contained in the container; a processing part for applying a treatment on the substrates; a transporting means for conveying the substrates arranged by the substrate arraying part, to the processing part; and a stand-by part for temporarily storing the substrate, which have been arranged by the substrate arraying part.

According to the fourth aspect of the present invention, there is also provided a substrate processing apparatus including: a container loading/unloading part for loading a container containing a plurality of substrates before processed and for unloading a container containing a plurality of substrates after processed; a substrate removing part for removing a plurality of substrates, to be processed, from a container, which contains the substrates spaced at regular intervals; a container transfer mechanism for conveying the container, containing the substrates therein, from the container loading/unloading part to the removing part; a substrate arraying part for arranging the substrates, which have been removed from two containers, so that the substrates are spaced at regular intervals, which are half of the size of the intervals that exist when the substrates are contained in the container; a processing part for applying a treatment on the substrates; a transfer means for conveying the substrates arranged by the substrate arraying part, to the processing part; and a stand-by part for temporarily storing the substrate, which have been arranged by the substrate arraying part.

According to the fourth aspect of the present invention, there is also provided a substrate processing method including the steps of: removing first substrates, to be processed, from two containers, in which the first substrates spaced at regular intervals are contained; arranging, at a substrate arraying part, the first substrates thus removed from said two containers, so that the first substrates are spaced at regular intervals, which are half of the size of the intervals that exist when the first substrates are contained in the container; making the first substrate thus arranged at the substrate arraying part to be temporarily and collectively stand by for transportation to a processing part; conveying second substrates, having been processed, from the processing part to the substrate arraying part, while the first substrates being kept to be stand by for the transportation to the processing part; accommodating the second substrates, having been processed, into two carriers; conveying the two containers in which the second substrates, having been processed, are thus contained; conveying the first substrates, which are stand by for transportation, to the processing part.

BRIEF DESCRIPTION OF THE DRAWINGS

FIG. 7 is a side view showing the wafer loading/unloading and arraying device of the cleaning apparatus in accordance with the first embodiment of the present invention;

FIG. 10 is a plan view showing a stand-by part of the cleaning apparatus in accordance with the first embodiment of the present invention;

FIG. 14 is a perspective view for explanation of a state to deliver wafers between the transfer device of FIG. 13 and the wafer transfer and arraying station;

DESCRIPTION OF THE PREFERRED EMBODIMENTS

Preferred embodiments of the present invention will be described with reference to the attached drawings. The description will be made by an example of applying the invention on a cleaning apparatus that executes loading, cleaning, drying and unloading operation for a batch of semiconductor wafers consistently.

Figure 1:
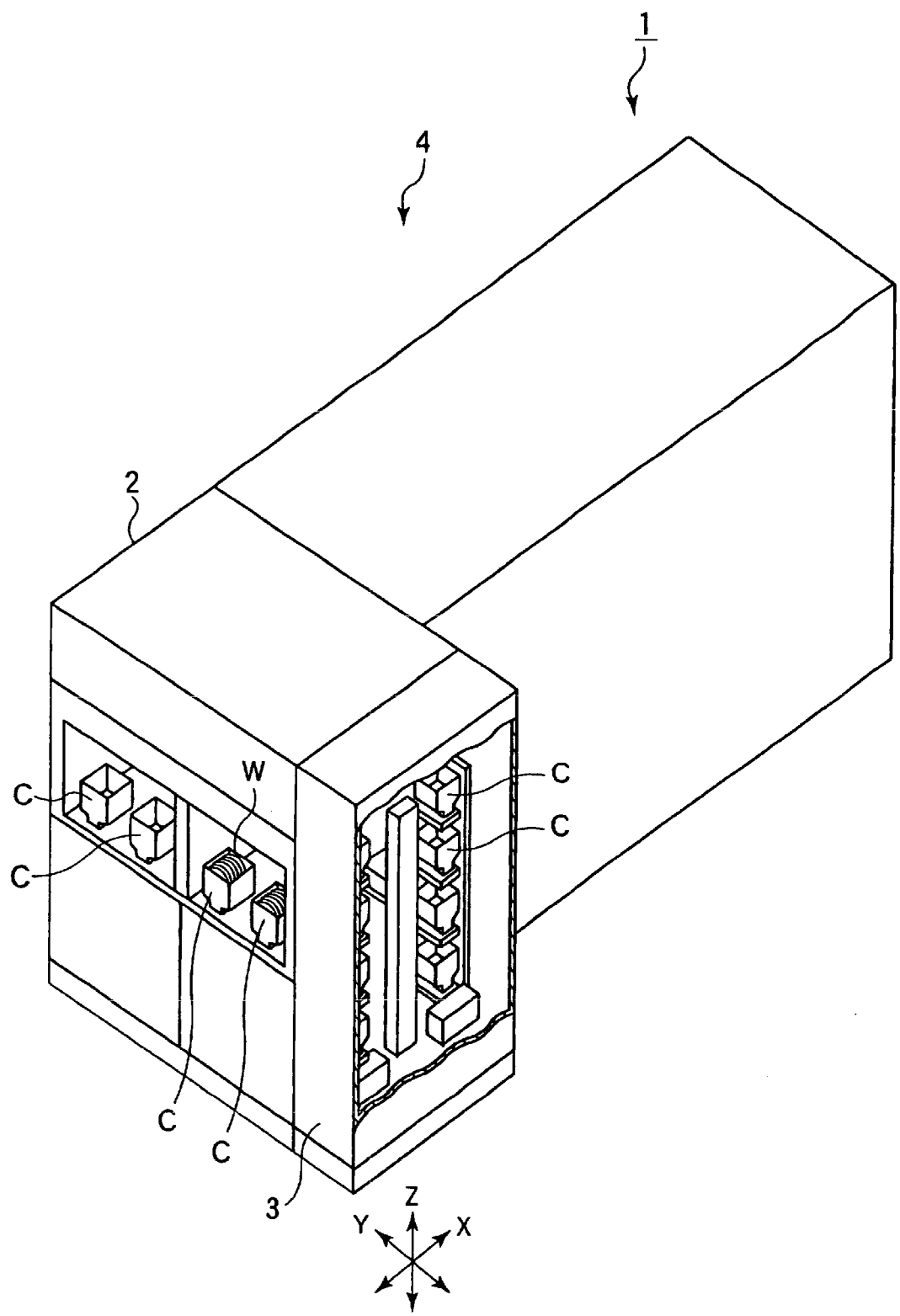
FIG. 1 is a perspective view of a cleaning apparatus in accordance with the first embodiment of the present invention.
Figure 2:
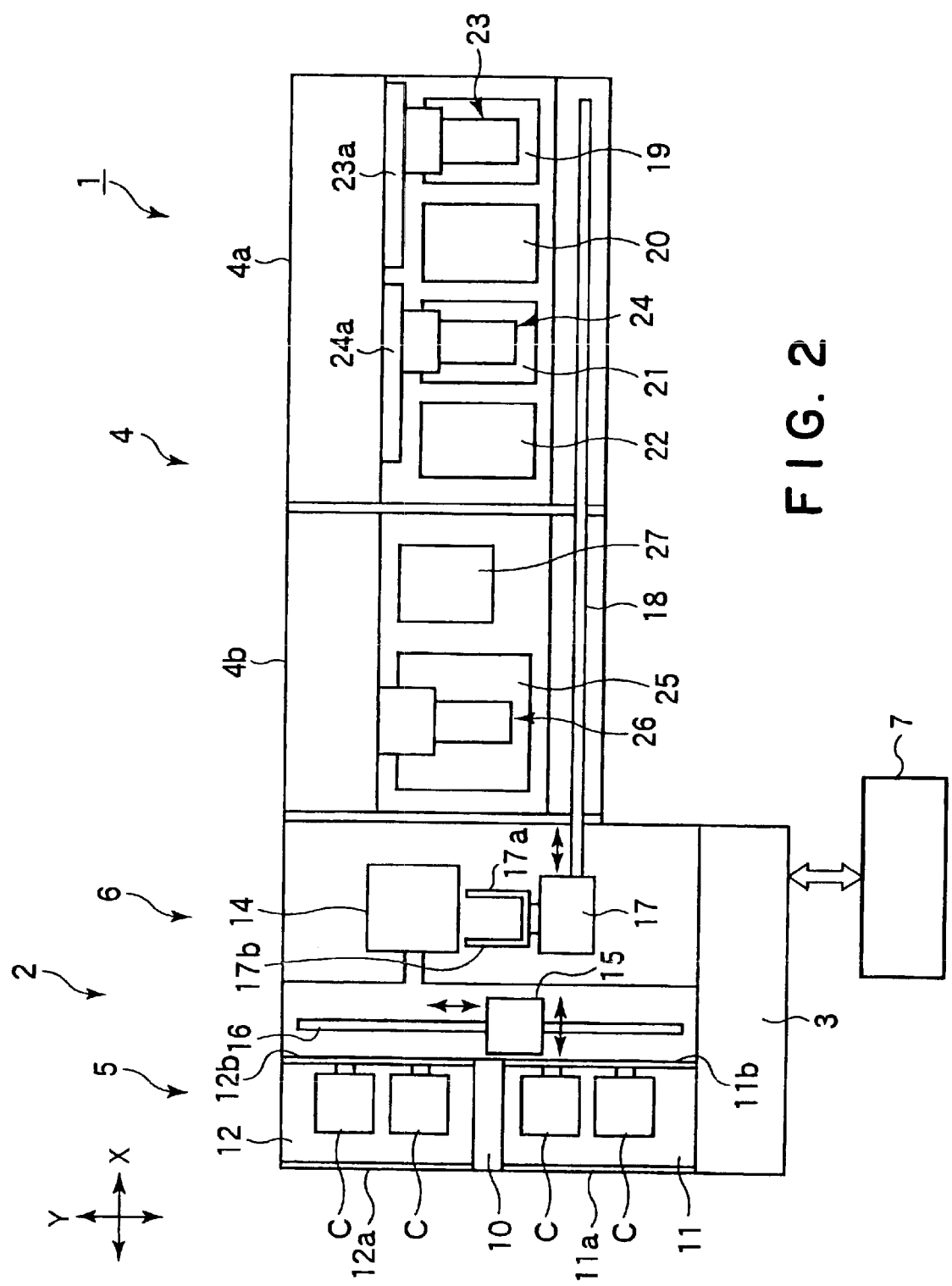
FIG. 2 is a plan view of the cleaning apparatus in accordance with the first embodiment of the present invention.

The first embodiment of a cleaning apparatus according to the present invention will be described with reference to FIGS. 1 and 2, showing a perspective view and a top plan view of the cleaning apparatus, respectively.

Referring to FIG. 1, the cleaning apparatus 1 includes: a loading/unloading and conveying block 2 for loading and unloading carriers C each capable of accommodating wafers W therein and also capable of arraying and conveying the wafers; a carrier stock block 3 for storing the carriers C; and a cleaning/drying block (processing part) 4 for cleaning and successively drying the wafers W.

Referring to FIG. 2, the carrier loading/unloading and conveying block 2 has a carrier loading/unloading station 5 (carrier loading/unloading part) and a wafer conveying/arraying station 6 (substrate conveying part). In the carrier loading/unloading station 5, loading and unloading of the carriers C are performed. In the wafer conveying/arraying station 6, loading and unloading of the wafers W to and from the carrier C are performed, and arranging and conveying of the wafers W are also performed. The wafer conveying/arraying station 6 is disposed between the loading/unloading station 5 and the cleaning/drying block 4.

The loading/unloading station 5 is arranged at an end of the apparatus 1 on the opposite side of the cleaning/drying block 4. The station 5 includes a carrier loading stage 11 for mounting two carriers C thereon and an carrier unloading stage 12 for mounting two carriers C having the processed wafer W loaded thereon. The loading stage 11 and the unloading stage 12 are separated from each other via a partitioning wall 10. The stages 11 and 12 are provided, on respective outside thereof, with outside shutters 11a, 12a, respectively. The stages 11 and 12 are also provided, on respective inside thereof, with inside shutters 11b, 12b, respectively. Upon opening the shutters 11a, 12a, 11b, 12b upward, the stages 11 and 12 can receive and send out the carries C.

Figure 3:
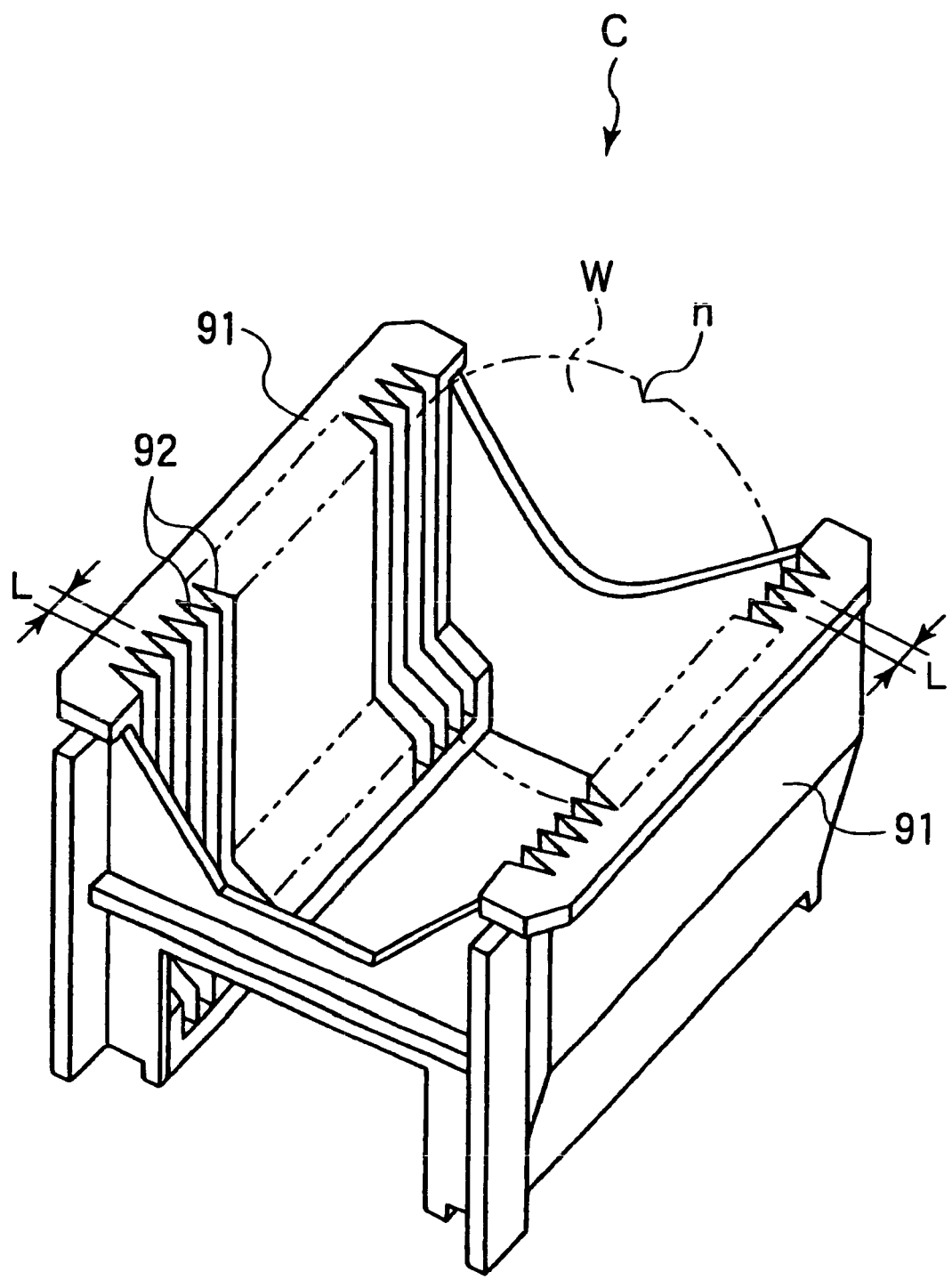
FIG. 3 is a perspective view showing a carrier.

Referring to FIG. 3, the carrier C has a pair of side-walls 91. Each of the side-walls 91 has a plurality of (in this embodiment, twenty-five) grooves 92 to retain the wafers W therein. The grooves 92 are arranged at regular intervals of L (L is 6.35 mm, in the event that the carrier C is designed for containing 8-inch wafers). When using the carrier C, the attitude of the carrier C is kept so that the grooves 92 extend vertically. The wafers W are arranged in the grooves 92 and facing the same direction. The notches n of the wafers W are aligned so that all of the notches n are directed upward. Thus, the wafers W are arranged in the horizontal direction so that they are spaced at regular intervals (L). In the case that the carrier loading stage 11 is to receive a carrier containing wafers which the notches n thereof are not aligned, a notch aligning mechanism (notch aligner) is provided below the carrier loading stage 11.

The wafer conveying/arraying station 6 includes a wafer loading/unloading and arraying device 14, which performs both loading and unloading of the wafers W to and from the carrier C and also arranging of the wafers W.

Between the carrier loading/unloading stages 11, 12 and the wafer loading/unloading and arraying device 14, a moving table 15 is arranged to convey the carrier C. The table 15 is movable along a guide 16 in the arraying direction of the carriers C (Y-direction). The moving table 15 conveyes the carriers C between the loading/unloading station 5 and the wafer loading/unloading and arraying device 14 in a later-mentioned manner.

As mentioned later in detail, the wafer loading/unloading and arraying device 14 removes the wafers W from carriers C, and arranges the wafers W thus removed from two carriers C so that the wafers are spaced at regular intervals, which are half of the size of the intervals that exist when the wafers W are held in carriers C. Accordingly, in the event that the carrier C is designed to contain twenty-five wafers W therein, the wafer loading/unloading and arraying device 14 arranges fifty wafers W in a row.

A transfer arm 17 conveys wafers W between the wafer loading/unloading and arraying device 14 and the cleaning/drying block 4. The transfer arm 17 receives fifty wafers W from the device 14 at the delivery position of the device, and moves along a guide 18 extending in a longitudinal direction of the cleaning/drying block 4 in order to transfer the wafers W between the delivery position of the device 14 and respective baths arranged in the block 4. The transfer arm 17 is equipped with two chucks 17a, 17b that hold the wafers W.

The carrier stock block 3 temporarily stores empty carriers C, from which the wafers W to be processed are removed, and also temporarily stores empty carriers C, into which the processed wafers W are to be accommodated. The carrier stock block 3 may temporarily store carriers C, in which the processed wafers or wafers to be processed is accommodated. Provision of the carrier stock block 3 improves the transporting efficiency of the moving table 15. The carrier stock block 3 is capable of storing a plurality of carriers C vertically. The carrier stock block 3 has a built-in carrier moving mechanism that operates to send out a carrier C therefrom and to place a carrier C in a predetermined position.

The cleaning/drying block 4 consists of a cleaning station 4a and a drying station 4b. The drying station 4b is interposed between the loading/unloading and conveying block 2 and the cleaning station 4a. The cleaning station 4a includes a first chemical bath 19, a first water-cleaning bath 20, a second chemical bath 21 and a second water-cleaning bath 22, arranged in that order from the end of the apparatus 1.

The cleaning station 4a further includes a first transfer device 23 and a second transfer device 24. The first transfer device 23 transfers the wafers W between the first chemical bath 19 and the first water-cleaning bath 20. The second transfer device 24 transfers the wafers W between the second chemical bath 21 and the second water-cleaning bath 22.

The first transfer device 23 horizontally moves along a guide 23a to move between the first chemical bath 19 and the first water-cleaning bath 20. The second transfer device 24 horizontally moves along a guide 24a to move between the second chemical bath 21 and the second water-cleaning bath 22.

A chemical liquid, ammonia solution for example, is stored in the chemical bath 19 to remove particles or the like adhering to the wafers W. An etching liquid, dilute fluoride acid for example, is stored in the second chemical bath 21 to etch oxidation films formed on the wafers W. A mixture of fluoride acid and fluoro-ammonium solution may be used as the etching liquid.

The first and second transfer devices 23, 24 can deliver and receive the wafers W to and from the transfer arm 17.

The drying station 4b is provided with a water-cleaning bath 25. Provided above the water-cleaning bath 25 is a drying chamber (not shown), in which vapor of isopropyl alcohol (IPA) is fed to the wafers W in order to dry wafers W.

A transfer device 26 is provided to move the wafers W between the water-cleaning bath 25 and the not-shown drying chamber. The wafers W, having been cleaned in the water-cleaning bath 25, are removed from the bath 25 by the transfer device 26, and subsequently dried with IPA in the not-shown drying chamber. The transfer device 26 is capable of delivering and receiving the wafers W to and from the transfer arm 17. Reference numeral 27 designates a chuck cleaning and drying unit that cleans and dries chucks 17a, 17b, which are the wafer holding members of the transfer arm 17.

Operations of aforementioned devices and mechanisms or the like included in this cleaning apparatus 1 and processes carried out by this cleaning apparatus 1 are controlled by a controller 7.

Next, the loading/unloading and conveying block 2 will be described in detail.

Figure 4:
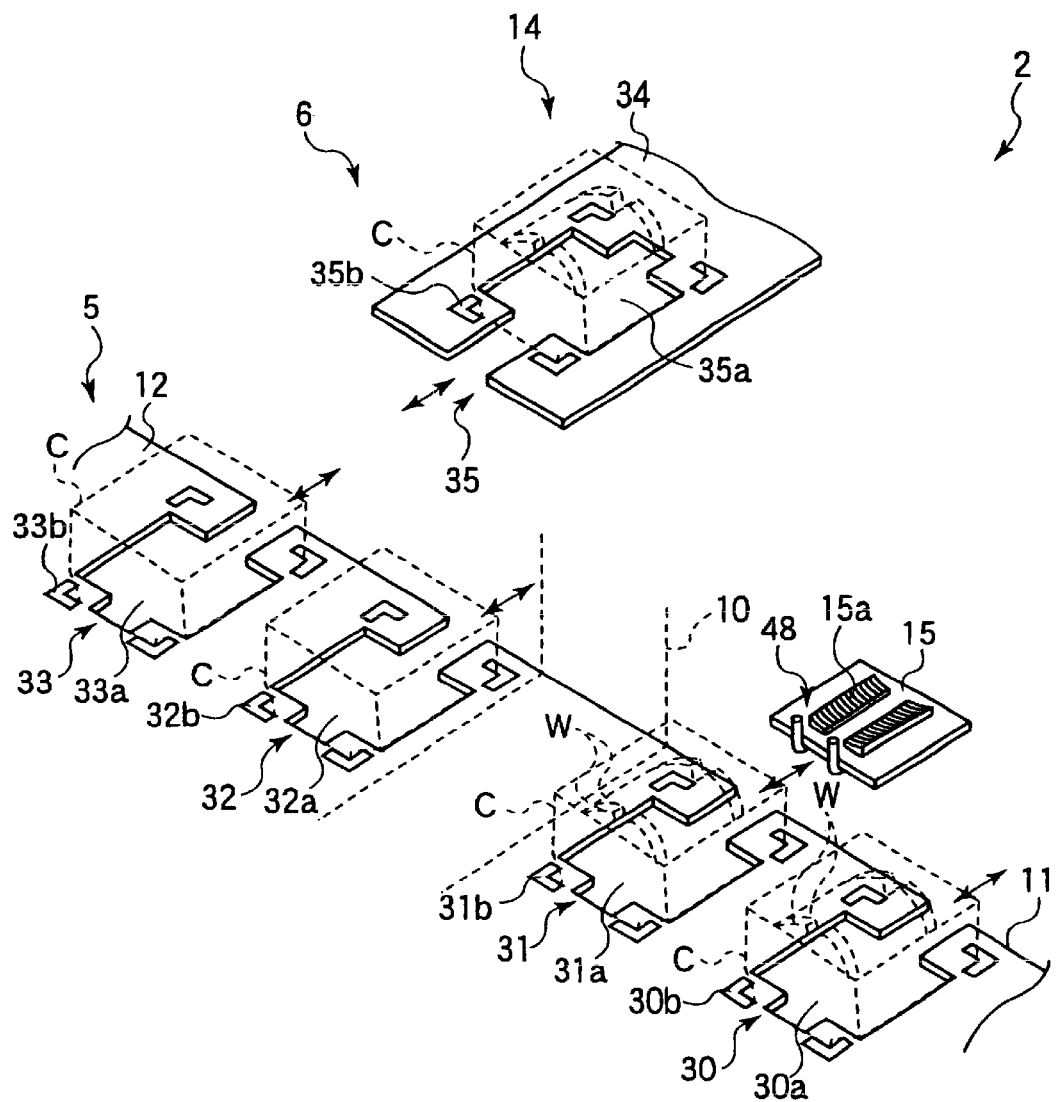
FIG. 4 is a perspective view showing a loading/unloading and transfer block of the cleaning apparatus in accordance with the first embodiment of the present invention.

Referring to FIG. 4, the carrier loading stage 11 of the carrier loading/unloading station 5 is provided with two carrier mounting ports 30, 31 having openings 30a, 31a, respectively. The shape of the openings 30a, 31a corresponds to that of the moving table 15. The carrier unloading stage 12 is also provided with two carrier mounting ports 32, 33 having openings 32a, 33a, respectively. The shape of the openings 32a, 33a also corresponds to that of the moving table 15.

The wafer loading/unloading and arraying device 14 of the wafer conveying/arraying station 6 includes a wafer loading/unloading stage 34 provided with a carrier mounting port 35. The carrier mounting port 34 also has an opening 35a, the shape of which corresponds to that of the moving table 15. Each of the carrier mounting ports 30, 31, 32, 33, 35 are provided with positioning guides 30b, 31b, 32b, 33b, 35b at positions corresponding to four corners of the carrier C placed on the port.

Referring to FIG. 4, the shape of the moving table 15 is substantially square as viewed in a vertical direction. The carrier C placed on the moving table 15, with projections formed on the bottom of the carrier C being engaged in grooves (not shown) formed on the upper face of the table 15. The upper face of the moving table 15 is provided with an alignment member 15a shaped similar to a comb and having grooves for truing up the wafers W contained in the carrier C.

Figure 5:
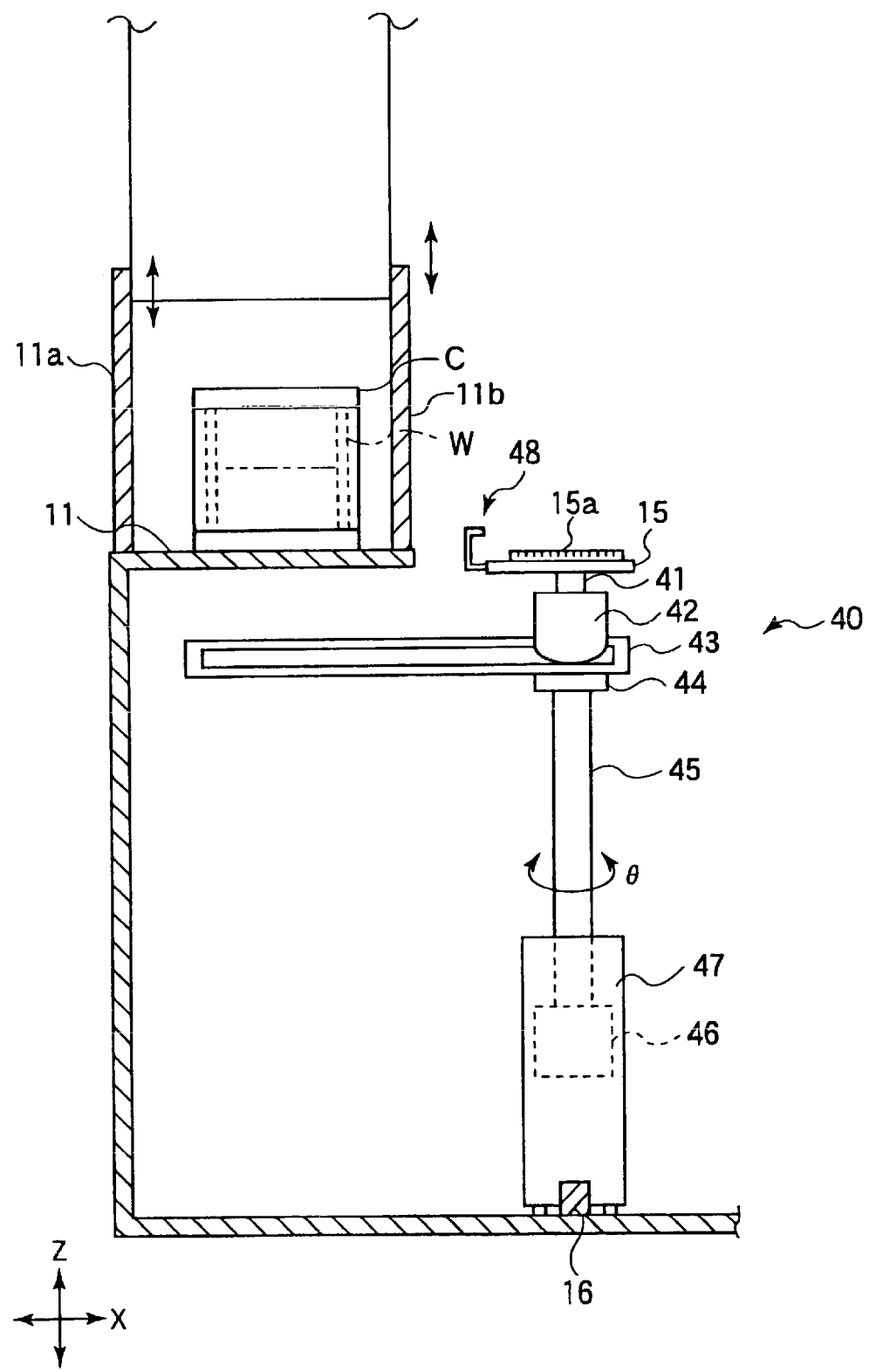
FIG. 5 is a side view showing a loading/unloading station and a moving table of the cleaning apparatus in accordance with the first embodiment of the present invention.

Referring to FIG. 5, the moving table 15 is moved by a moving mechanism 40. The moving mechanism 40 includes an elevator shaft 41, an elevator mechanism 42, a guide rail 43, a driving mechanism (not shown), a rotating shaft 45, a rotating mechanism 46 and a base member 47. The elevator shaft 41 supports the moving table 15. The elevator mechanism 42 moves the elevator shaft 41 up and down to move the moving table 15 vertically. The guide rail 43 guides the elevator mechanism 42 in X-direction. The not-shown driving mechanism moves the elevator mechanism 42 along the guide rail 43. The rotating shaft 45 is fixed to the guide rail 43 via a fixing member 44. The rotating mechanism 46 rotates the rotating shaft 45 together with the guide rail 43. The base member 47 is internally provided with the rotating mechanism 46, and moves along Y-direction guided by a guide rail 16.

In operation, the base member 47 guided by the guide rail 16 moves in Y-direction to a position corresponding to any one of the carrier mounting ports 30, 31, 32, 33, 35. Then, the elevator mechanism 42 moves along the guide rail 16 to penetrate right below the opening 30a, 31a, 32a, 33a or 35a of the carrier mounting port 30, 31, 32, 33 or 35. Then, the moving table 15 moves up by the elevator mechanism 42 in order to pass through the opening of the port and lift up the carrier C from the port. Then, the table 15 moves horizontally to leave the port. According to the above, the carrier C placed on the port is transferred to the moving table 15. When the carrier C is transferred from the moving table 15 to the ports 30, 31, 32, 33, 35, the aforementioned steps are executed in the inverse order. The carrier C thus can be moved between the carrier loading stage 11, the carrier unloading stage 12 and the wafer loading/unloading stage 34.

Attached to the leading end of the moving table 15 is a wafer sensor 48, which consists of light emitting and receiving elements. The wafer sensor 48 detects the number of wafers W and the presence of so-called "jump slot", when the moving table 15 is moving below the carrier C in order to receive the carrier C, containing unprocessed wafers W, placed on the wafer loading stage 11.

Figure 6:
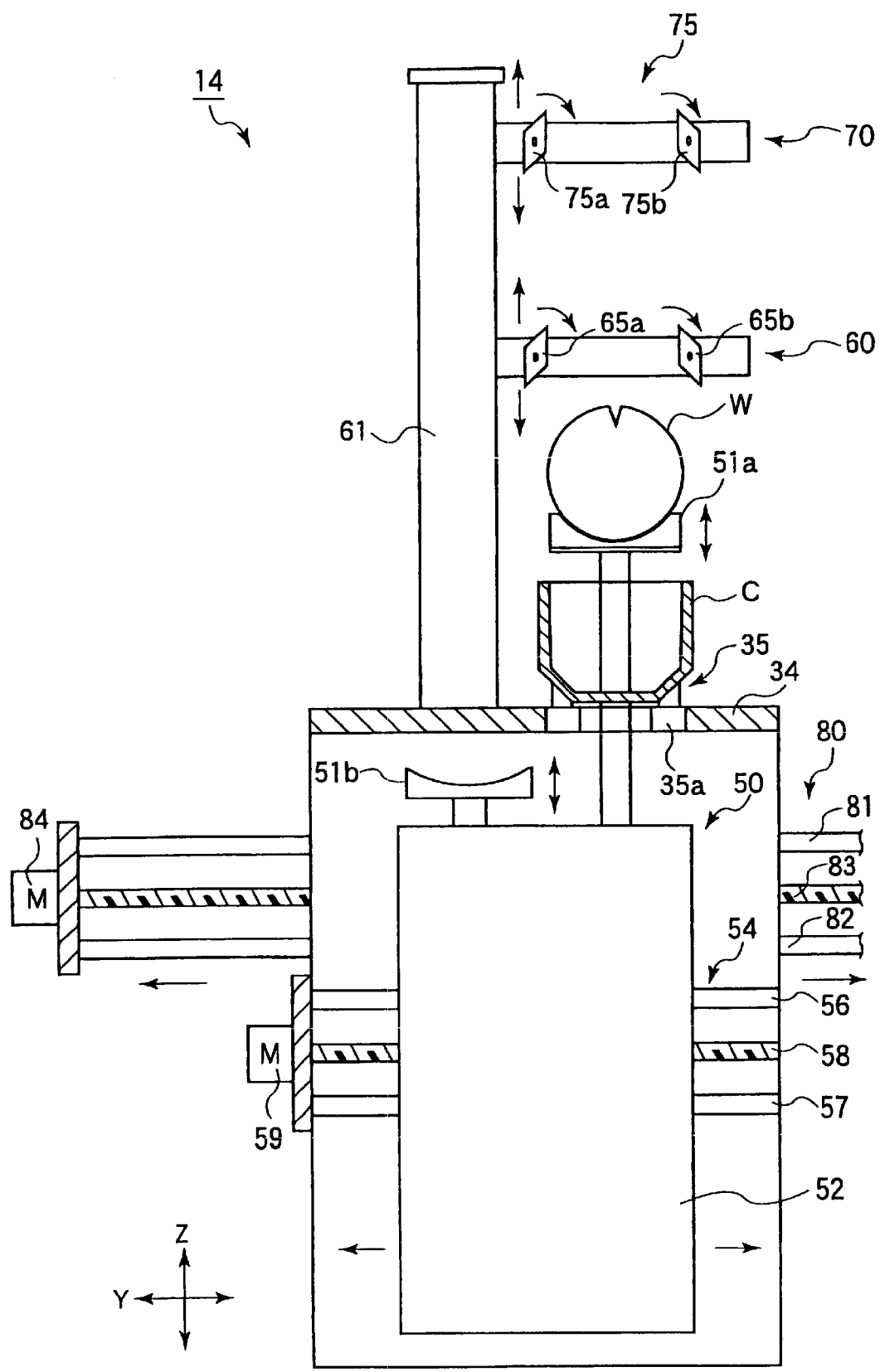
FIG. 6 is a front view showing a wafer loading/unloading and arraying device of the cleaning apparatus in accordance with the first embodiment of the present invention.
Figure 7A:
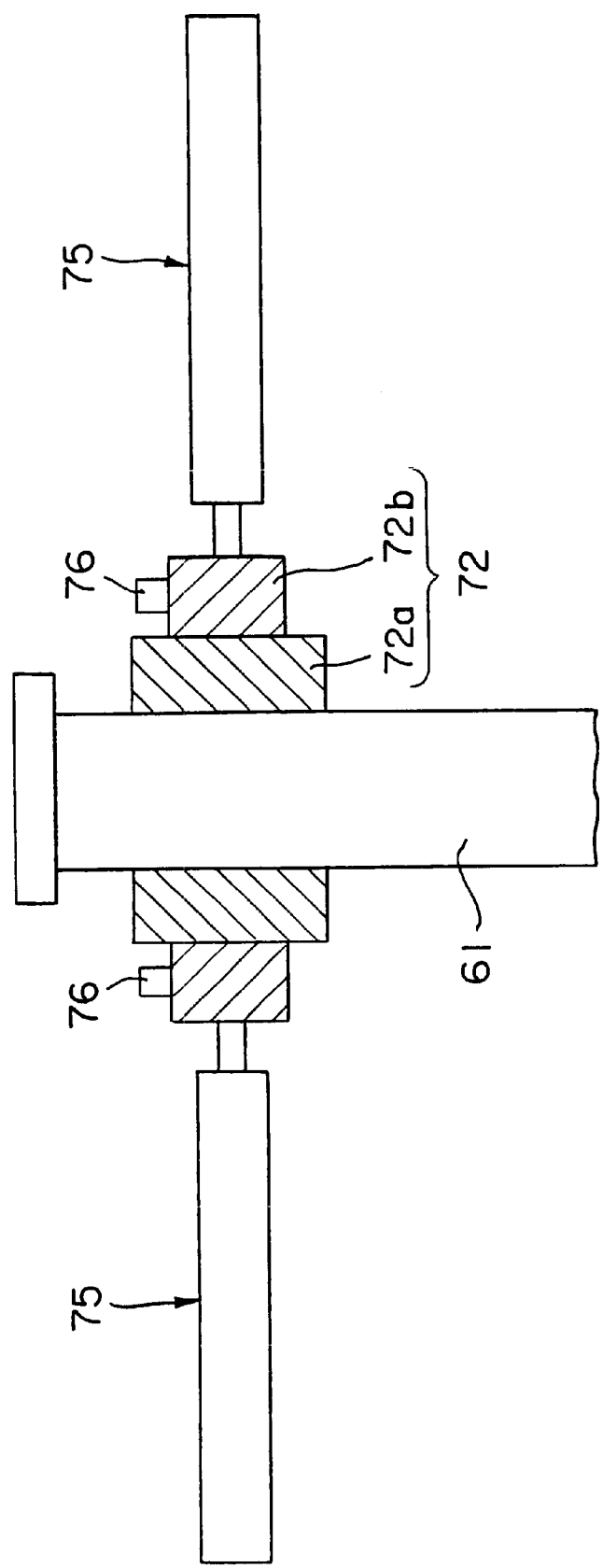
FIG. 7A is a side view showing a modification of the wafer loading/unloading and arraying device of FIG. 7.
Figure 8:
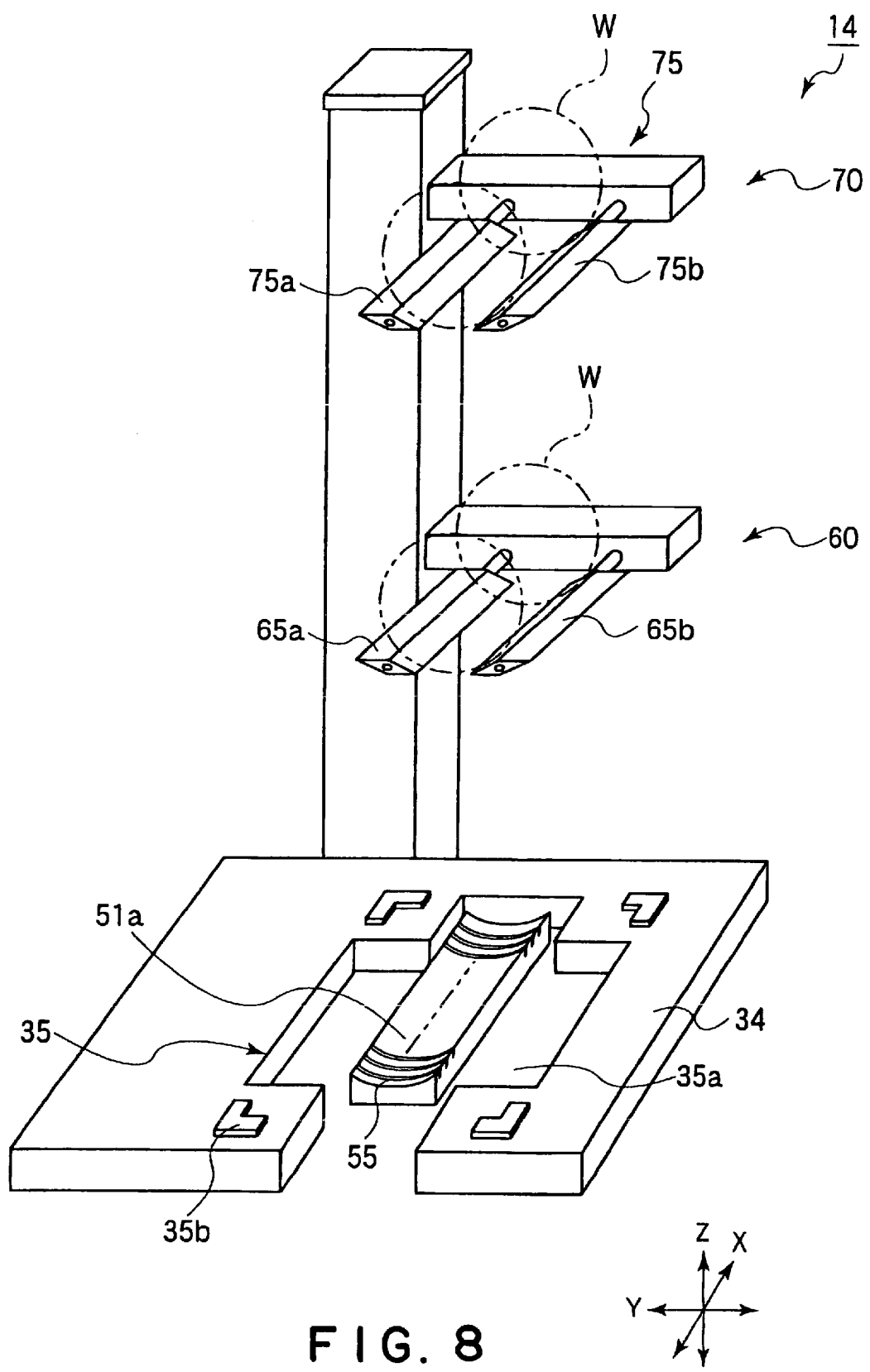
FIG. 8 is a perspective view showing the wafer loading/unloading and arraying device of the cleaning apparatus in accordance with the first embodiment of the present invention.

Referring to FIGS. 6 to 8, the wafer loading/unloading and arraying device 14 includes said wafer loading/unloading stage 34, a wafer holding mechanism 50, a pitch changer 60 and a stand-by mechanism 70. The wafer holding mechanism 50 is arranged below the stage 34, and holds wafers W in order to remove and accommodate the wafers W from and into the carrier C placed on the carrier mounting port 35. The pitch changer 60 (substrate arraying part) is positioned above the wafer loading/unloading stage 34. The pitch changer 60 arranges the wafers W removed from two carriers C (in this embodiment, fifty wafers), so that the wafers W are spaced at regular intervals (L/2), which are half of the size of the intervals (L) that exist when the wafers are contained in the wafer carriers C. The stand-by mechanism 70 is arranged above the pitch changer 60 in order to temporarily store the wafers W, having been arranged and spaced at the intervals (L/2) by the pitch changer 60.

The wafer loading/unloading and arraying device 14 moves, as a whole, horizontally between a first position (wafer loading/unloading position) where loading and unloading of the wafers W to and from the carrier C is carried out, and a second position (wafer transferring position) where the transferring of the wafers W between the device 14 and the wafer transfer arm 17 is carried out. A driving mechanism 80 is provided for the horizontal movement of the device 14. The driving mechanism 80 includes a pair of LM guides 81, 82 extending horizontally, a screw shaft 83 forming a part of a ball-screw mechanism and extending horizontally between the LM guide 81 and the LM guide 82, and a motor 84 for rotationally driving the screw shaft 83.

The wafer holding mechanism 50 has a pair of wafer hands 51a, 51b, a base part 52 and a driving mechanism 54. The base part 52 internally provided with an elevator mechanism (not shown) for moving these wafer hands 51a, 51b up and down and a rotating mechanism (not shown) for rotating the wafer hands 51a, 51b about vertical axes thereof. The driving mechanism 54 moves the base member 52 in Y-direction.

The wafer hand 51a is provided exclusively for unloading wafers W from a carrier C, and the wafer hand 51b is provided exclusively for loading the wafers into a carrier C. In operation, the base member 52 moves so that either one of the wafer hands 51a and 51b, to be used, is positioned right below the carrier mounting port 35 by the driving mechanism 54.

Each of the wafer hands 51a, 51b has a plurality of grooves (in this embodiment, fifty grooves) so that the wafer hands capable of holding wafers, removed from two carriers C, at one time. The grooves are spaced at regular interval (L/2).

The driving mechanism 54 includes: a pair of LM guides 56, 57 extending horizontally; a screw shaft 83 forming a part of a ball-screw mechanism and extending horizontally between the LM guides 56 and 57; and a motor 59 for rotationally driving the screw shaft 58. Engaging members 52a, 52b extend from the base part 52 to engage with the LM guides 56, 57 (see FIG. 7).

The pitch changer 60 includes a guide member 61, a support member 62, a driving mechanism 63 (see FIG. 7), a pair of rotating shafts 64a, 64b, a pair of wafer holding members 65a, 65b and a rotating mechanism 66. The guide member 61 is attached to the wafer loading/unloading stage 34 and extends upward therefrom. The support member 62 moves along the guide member 61. The driving mechanism 63 moves the support member 62 vertically along the guide member 61. The rotating shafts 64a, 64b extend, in parallel with each other, from the support member 62 horizontally. The wafer holding members 65a, 65b are attached to the rotating shafts 64a, 64b, respectively, and extending horizontally, to retain the wafers W thereon. The rotating mechanism 66 rotates the rotating shafts 64a, 64b in the direction indicated by arrows shown in of FIG. 6. The rotational position of the wafer holding members 65a, 65b thus can be switched between two horizontal-holding-positions (see FIG. 8) and vertical-non-holding positions (see FIG. 6).

Figure 9:
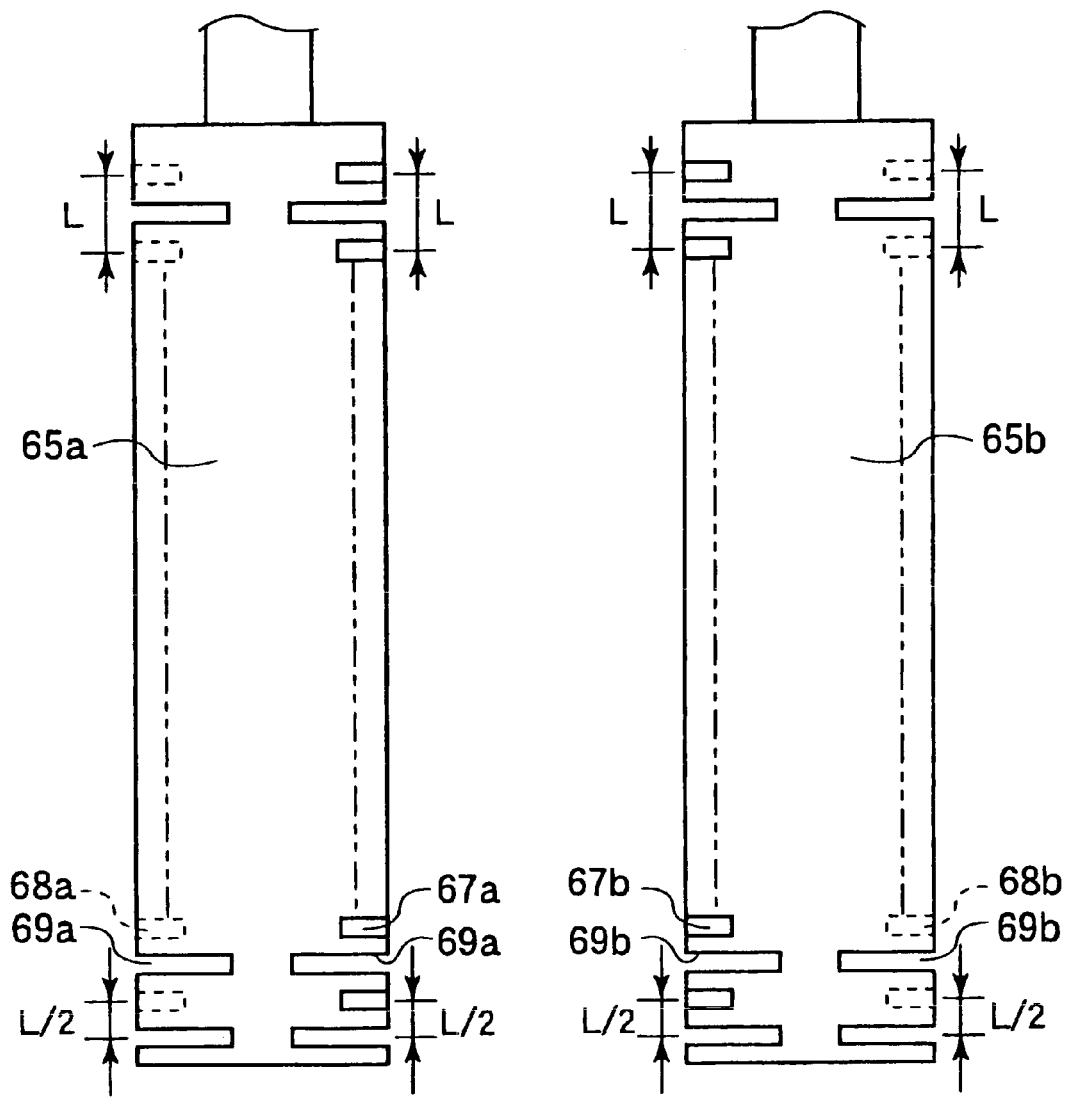
FIG. 9 is a plan view showing wafer retaining members in the loading/unloading and arraying device of the cleaning apparatus in accordance with the first embodiment of the present invention.

As shown in FIG. 9, wafer holding grooves 67a, 67b are provided at a first (inside) edge portion of a first surface of each of the wafer holding members 65a, 65b. The number of the grooves 67a, 67b of each of the wafer holding members 65a, 65b corresponds to the number of the wafers W (in the embodiment, twenty-five) to be contained in one carrier C. The grooves 67a, 67b are spaced at regular intervals (L), which are the same as the size of the intervals (L) that exist when the wafers W are contained in the wafer carriers C. Wafer holding grooves 68a, 68b are also provided at a second (outside) edge portion of a second surface of each of the wafer holding members 65a, 65b. The grooves 68a, 68b are also spaced at regular intervals (L).

The grooves 67a, 67b are used for holding the wafers W, to be processed in the cleaning/drying block 4 (unprocessed wafers W), which are removed from the carrier C placed on the loading/unloading stage 34. The wafer holding members 65a, 65b turn over (180-degree rotation) to hold the wafers W, having been processed in the cleaning/drying block 4, by the grooves 68a, 68b.

Slits 69a are formed between adjacent wafer holding grooves 67a of the wafer holding member 65a. Slits 69b are also formed between adjacent wafer holding grooves 68a of the wafer holding member 65b. The slits 69a are spaced at regular intervals (L). The slits 69b are spaced at regular intervals (L). The wafers W can pass through the slits 69a, 69b.

The wafer holding grooves 67a and the slits 69a are alternately arranged on the wafer holding member 65a at regular intervals (L/2). The wafer holding grooves 68a and the slits 69b are alternately arranged on the wafer holding member 65b at regular intervals (L/2).

When handling unprocessed wafers W, to be conveyed to cleaning/drying block 4, the wafer holding grooves 67a, 67b of the pitch changer 60 are positioned inside, as shown in FIG. 9, and receives first (twenty-five) wafers W, which are removed from a first carrier C and spaced at regular intervals (L), from the wafer hand 51a.

Then, the wafer hand 51a raises to remove second (twenty-five) wafers W from the second carrier C and to retain them, rotates with an angle of 180 degrees, and receives the first wafers W from the pitch changer 60. Thus, the first and the second wafers W spaced at regular intervals (L/2) are retained on the wafer hand 51a, and respective mirror (front) faces of the first wafers W oppose respective mirror (front) faces of the second wafers W.

When processed wafers W are conveyed from cleaning/drying block 4 to the wafer loading/unloading and arraying device 14, the processed wafers W are retained by the wafer hand 51b spaced at regular intervals (L/2). Then, the half of the wafers W is transferred to the wafer holding members 65a, 65b, with the wafer holding grooves 68a, 68b being directed inward. The other half of the wafers W, remaining on the wafer hand 51b and spaced at regular intervals (L), are moved downward and pass through the slits 69a, 69b in order to be accommodated in a first carrier. The wafers W retained on the wafer holding members 65a, 65b are then transferred to the wafer hand 51b, and are accommodated in a second carrier.

Referring to FIGS. 6, 7 and 10, the stand-by mechanism 70 includes a support member 72, a driving mechanism 73 (see FIG. 7), a pair of rotating shafts 74a, 74b, a stand-by part 75 and a rotating mechanism 76. The support member 72 is driven by the driving mechanism 73 to move along the guide member 61 vertically. The rotating shafts 74a, 74b extend, in parallel with each other, from the support member 72 horizontally. The stand-by part 75 is provided for temporarily stores the wafers W. The stand-by part 75 comprises a pair of wafer holding members 75a, 75b, which are horizontally attached to the rotating shafts 74a, 74b, respectively. The rotating mechanism 76 rotates the rotating shafts 74a, 74b to rotate the wafer holding members 75a, 75b in the direction indicated by arrows in FIG. 6. The positions of the wafer holding members 75a, 75b is switched between horizontal-holding position (see FIG. 8) and vertical-non-holding position (see FIG. 6), upon rotation of the members 75a, 75b.

Referring to FIG. 10, the wafer holding member 75a has opposite edge portions, which are provided with a plurality of wafer holding grooves 77a, 78a. The number of the grooves 77a (78a) corresponds to that of wafers W contained in two carriers (in this embodiment, fifty). The grooves 77a (78a) are spaced at regular intervals (L/2). Wafer holding grooves 77b, 78b are also formed at opposite edge portions of the wafer holding member 75b in the same manner as those in the wafer holding member 75a.

This wafer stand-by mechanism 70 can temporarily store wafers W, in the event that the timing of pitch-changing and conveying operations for unprocessed wafers W and those operations for processed wafers W overlaps. For example, if the timing of conveying the unprocessed wafers W to the cleaning/drying block 4 and conveying the processed wafers W to the cleaning/drying block 4 overlaps, fifty wafers W, having been arranged by the pitch changer 60, are temporarily stored at the stand-by mechanism 70. After the processed wafers W are accommodated in a carrier C and the same carrier C is transferred to the moving table 15, the unprocessed wafers W is conveyed to the cleaning/drying block 4 from the stand-by mechanism 70.

In this case, as shown in FIG. 10, the wafer holding grooves 77a, 77b are positioned inside to retain the unprocessed wafers W therein. The processed wafers W conveyed from the cleaning/drying block 4 may also be temporarily stored at the stand-by mechanism 70. In this case, the wafer holding grooves 78a, 78b are positioned inside to retain the wafers W therein.

Figure 11:
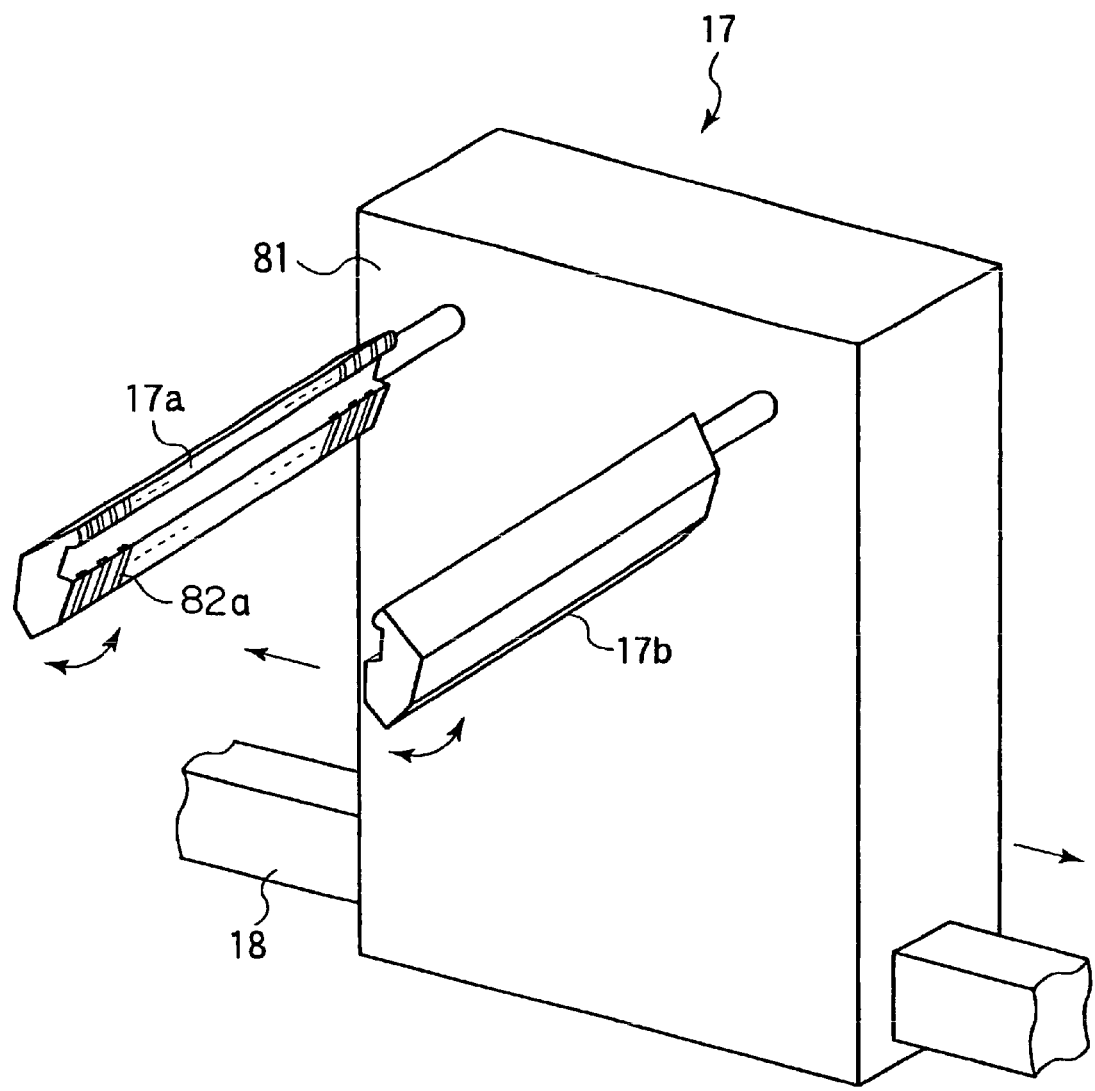
FIG. 11 is a perspective view showing a transfer device at a wafer transfer and arraying station of the cleaning apparatus in accordance with the first embodiment of the present invention.
Figure 12:
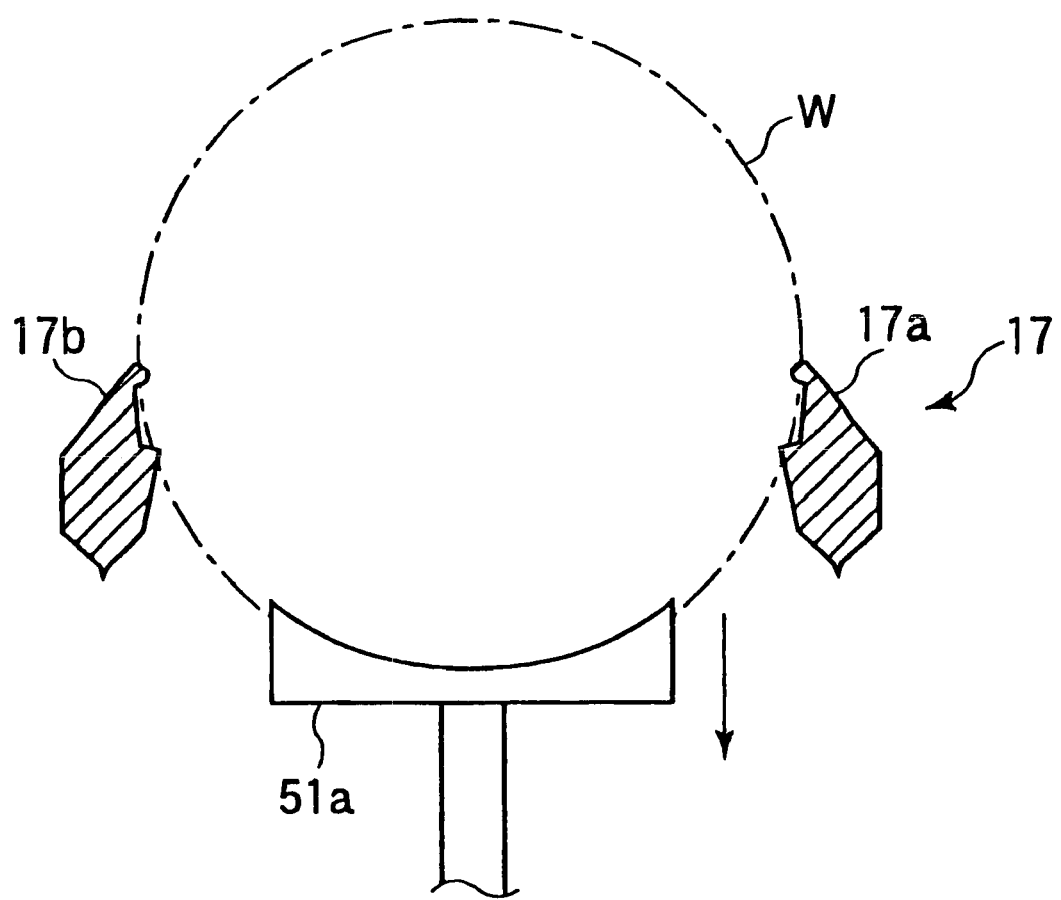
FIG. 12 is a schematic view showing a state to deliver a wafer between a wafer hand and the transfer device at the wafer transfer and arraying station of the cleaning apparatus in accordance with the first embodiment of the present invention.

Referring to FIG. 11, the transfer arm 17 includes the above-mentioned chucks 17a, 17b in pairs and a support member 81 that supports the chucks 17a, 17b. The support member 81 includes a built-in rotating mechanism (not shown) for rotating the chucks 17a, 17b in the direction indicated by arrows. The support member 81 moves along the guide 18. The chucks 17a, 17b have a plurality of wafer holding grooves 82a, 82b (grooves 82b cannot be seen), respectively. The number of the grooves 82a (82b) corresponds to that of wafers W to be contained in two carriers C (in this embodiment, fifty). The grooves 82a (82b) are spaced at regular intervals (L/2).

When delivering unprocessed wafers W from the wafer hand 51a to the transfer arm 17, the chucks 17a, 17b of the transfer arm 17 are positioned below the wafer hand 51a holding the wafers W, thereafter the wafer hand 51a is lowered. When delivering the cleaned (processed) wafers W from the transfer arm 17 to the wafer hand 51b, the chucks 17a, 17b of the transfer arm 17 are positioned above the wafer hand 51b holding the processed wafers W, thereafter the wafer hand 51b is raised.

Figure 13:
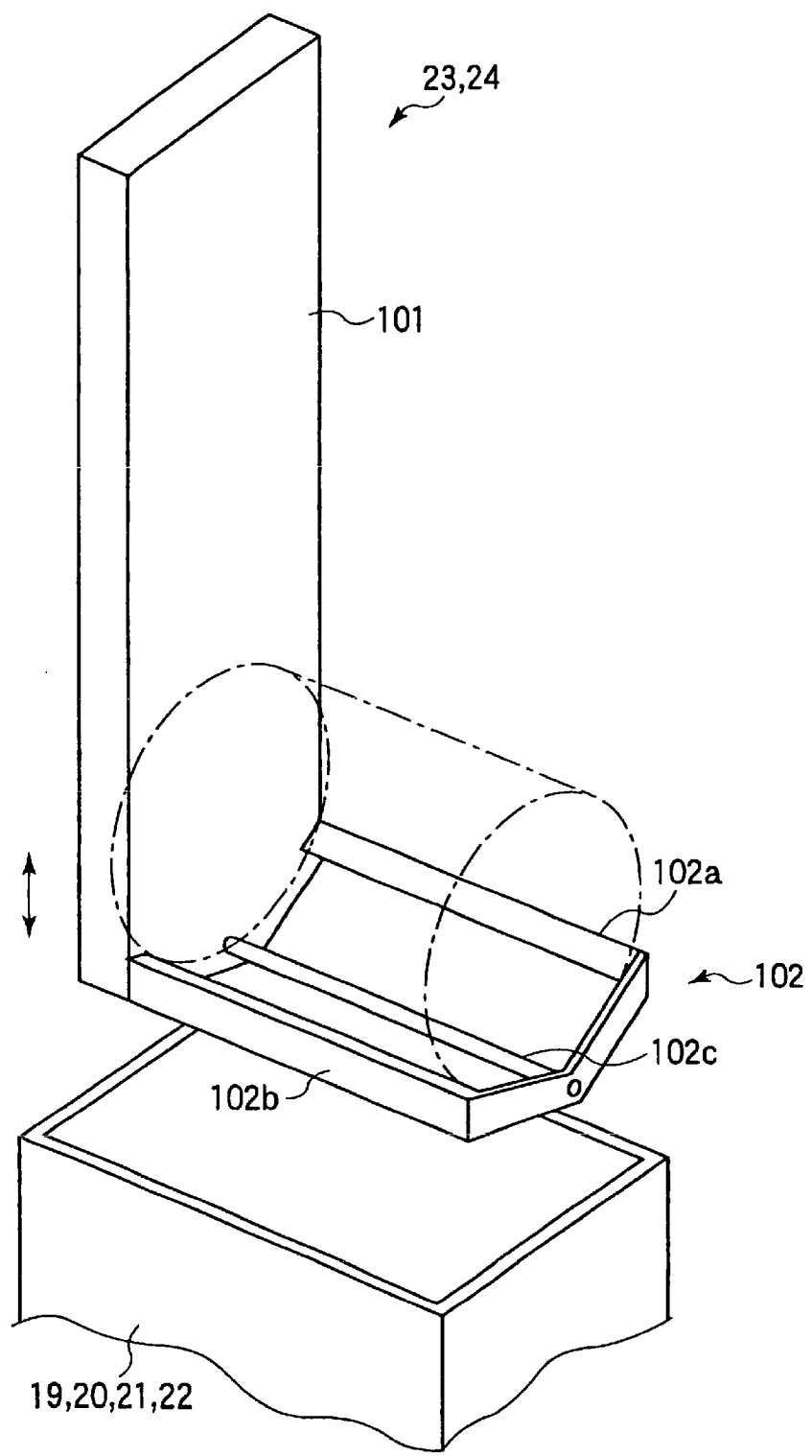
FIG. 13 is a perspective view showing the transfer device at a cleaning/drying block of the cleaning apparatus in accordance with the first embodiment of the present invention.

The first and second transfer devices 23, 24, which are provided in the cleaning station 4a of the cleaning/drying block 4, are the same in structure. As shown in FIG. 13, each of the transfer devices 23, 24 includes a support member 101 movable along guide members (not shown) horizontally and vertically and a wafer holding part 102 arranged on the lowermost end of the support member 101 to hold a plurality of wafers W. The wafer holding part 102 is provided with three rods 102a, 102b, 102c for supporting fifty wafers W.

When lowering the support member 101 with the wafers W supported on the wafer holding part 102, the transfer device 23 (24) is capable of immersing the wafers in processing liquids stored in any one of the processing baths of the cleaning/drying block 4.

When transferring wafers W from the chucks 17a, 17b of the transfer arm 17 to the first or second transfer device 23, 24, the chucks 17a, 17b holding the wafers W are positioned right above the wafer holding part 102, thereafter the support member 101 is raised to move the wafer holding part 102 upward. When transferring wafers W from the wafer holding part 102 to the chucks 17a, 17b, the chucks 17a, 17b are lowered so that the wafer holding part 102 passes between the chucks 17a, 17b (see FIG. 14).

The transfer device 26, which is provided at the drying station 4b, has a structure similar to those of the above-mentioned first and second transfer devices 23, 24. The transfer device 26 thus can deliver and receive the wafers W to and from the transfer arm 17.

Figure 15:
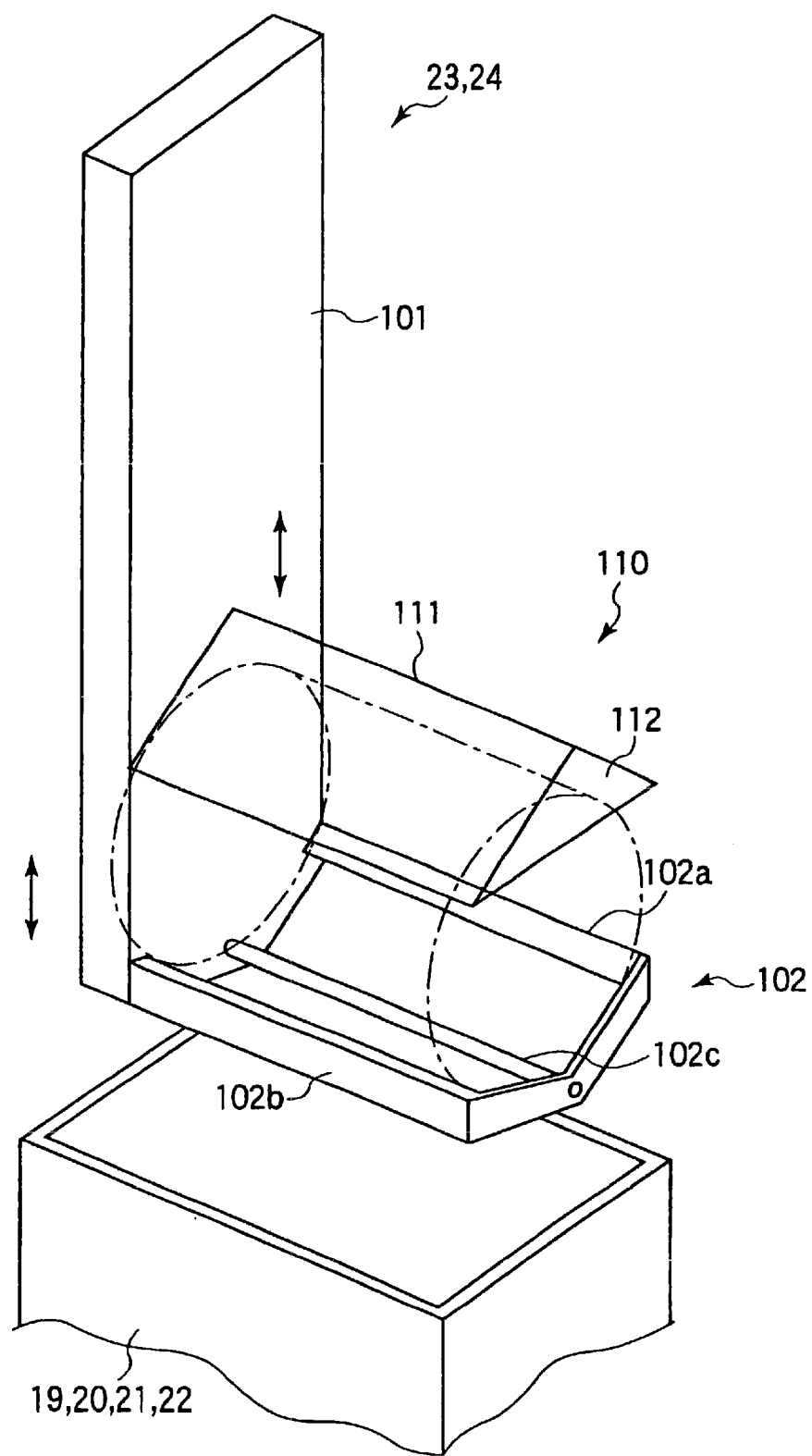
FIG. 15 is a perspective view showing a state where a cover member is added to the transfer device of FIG. 13.

As shown in FIG. 15, the transfer devices 23, 24 are preferably provided with a cover 110 positioned above the wafers W held by the wafer holding part 102, in view of preventing uneven evaporation of the chemical liquid and adhesion of particles to the wafers W.

The cover 110 has a triangular shape. The cover 110 includes a peaked-shaped member 111 extending along a direction in which the wafers are arranged and a closing member 112 that closes the distal end of the member 111. The proximal end of the member 111 is fixed to and closed by the support member 101. The cover 110 prevents air flowing in an area about the upper portion of the wafers, and thus prevents an occurrence of uneven evaporation of the chemical liquid. The cover 110 also prevents adhesion of particles to the wafers W. The shape of the cover 110 is not limited to that as illustrated.

The operation of the cleaning apparatus 1 will be described.

The moving table 15 conveys the carrier C, having been transported from an external of the apparatus 1 to the loading stage 11 of the loading and unloading station 5, to the wafer loading/unloading stage 34 of the wafer loading/unloading and arraying device 14.

The device 14 removes the wafers W from the carrier C, and arranges the wafers W (in this embodiment, fifty wafers W) thus removed from two carriers C, so that the wafers are spaced at regular intervals (L/2), which are half of the size of the intervals (L) that exist when the wafers W are held in the wafer carriers C. The device 14 delivers the wafers W thus arranged to the transfer arm 17.

Figure 16:
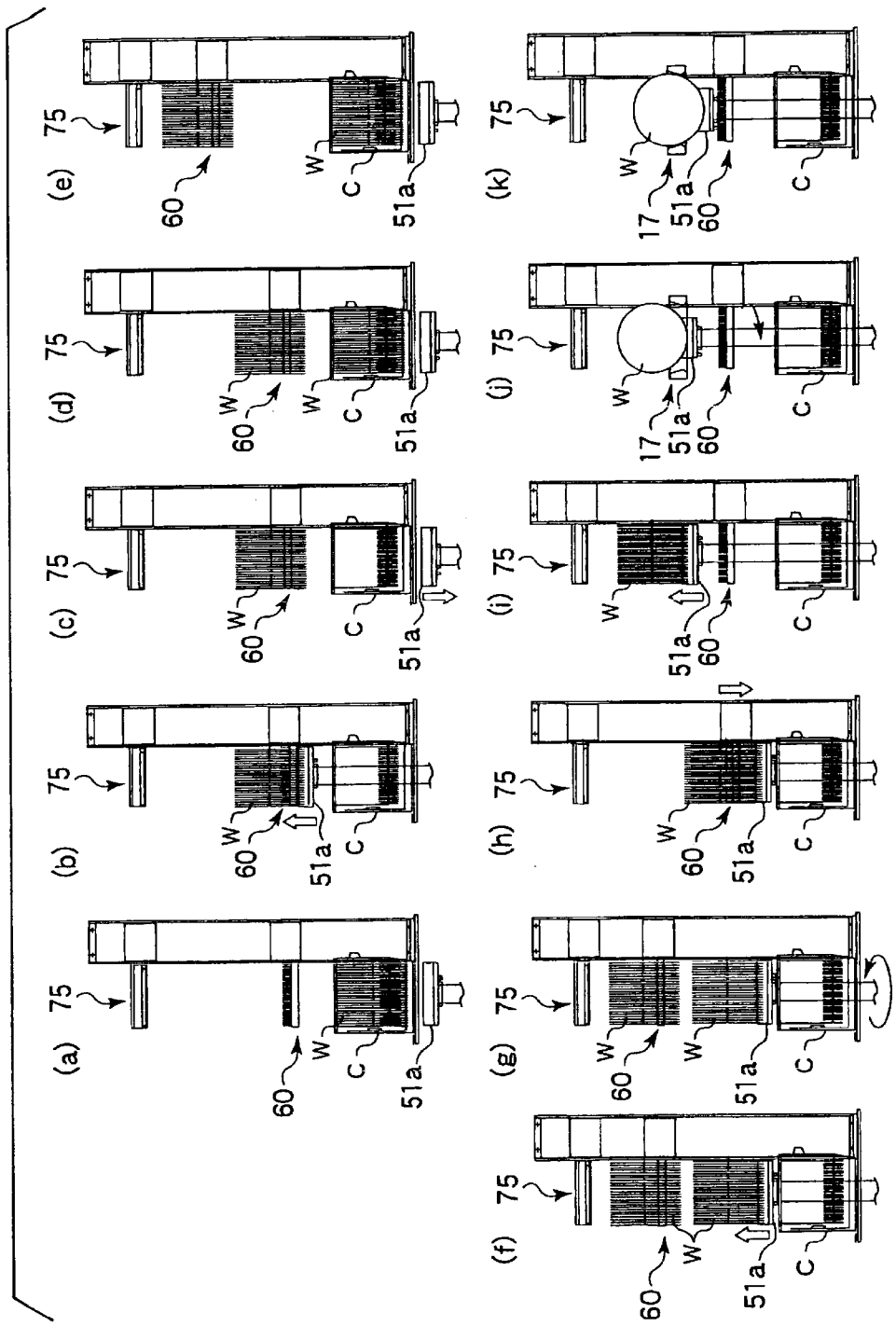
FIG. 16 is a view for explanation of processing steps in the wafer loading/unloading and arraying device when loading the wafers in case of no wafer unloaded from the cleaning/drying block.

In the event that there is no processed wafers W conveyed from the cleaning/drying block 4, there are performed both arrangement of the wafers in the wafer loading/unloading and arraying device 14 and conveying of the unprocessed wafers W to cleaning/drying block 4 according to the process steps as shown in FIG. 16.

A first carrier C, in which twenty-five unprocessed wafers W are accommodated at regular interval (L), is transferred from the moving table 15 to the carrier mounting port 35 of the wafer loading/unloading stage 34 (see FIG. 16(a)).

Then, the wafer hand 51a raises to lift up the wafers W contained in the carrier C, and the wafers W are thus held by the wafer hand 51a, with the wafers W being spaced at regular interval (L). The wafer hand 51a further raises to move the wafers W up to a position corresponding to the wafer holding members 65a, 65b (see FIG. 16(b)).

The wafer holding members 65a, 65b turns to be in the horizontal-holding position in order to direct the wafer holding grooves 67a, 67b inward, thereby to hold the twenty-five wafers W thereon, with the wafers W being spaced at regular interval (L) (see FIG. 16(c)).

The empty carrier C, from which the wafers W are removed, is transported to the carrier stock block 3 by the moving table 15. Thereafter, a second carrier C is placed on the carrier mounting port 35 of the wafer loading/unloading stage 34 (see FIG. 16(d)).

Subsequently, the wafer holding members 65a, 65b of the pitch changer 60 raise (see FIG. 16(e)).

The wafer hand 51a raises to remove the twenty-five wafers W from the second carrier C and to moves up the wafers W just below the members 65a, 65b (see FIG. 16(f)).

The wafer hand 51a turns by an angle of 180 degrees so that the front faces of the wafers W supported on the wafer hand 51a are opposed to the front faces of the wafers W retained on the pitch changer 60 (see FIG. 16(g)). In this state, the wafers W supported on the wafer hand 51a are located right below the spaces between adjacent wafers W held by the pitch changer 60.

The holding members 65a, 65b of the pitch changer 60 move downward, so that the wafers W held by the holding members 65a, 65b are inserted into the spaces between adjacent wafers W supported on the wafer hand 51a. Thereupon, fifty wafers W of two carriers are retained on the wafer hand 51a at regular intervals (L/2) (see FIG. 16(h)).

Next, the wafer holding members 65a, 65b of the pitch changer 60 turn to be in their vertical-non-holding position and to release the wafers W. The wafer hand 51a retaining the fifty wafers W are elevated up to the conveying position (see FIG. 16(i)).

The wafer hand 51a turns by an angle of 90 degrees, so that the chucks 17a, 17b of the transfer arm 17 can receive the wafers W retained on the wafer hand 51a.

Thereafter, the whole wafer loading/unloading and arraying device 14 moves to the transferring position, where the wafers W retained on the wafer hand 51a are located right above the chucks 17a, 17b of the transfer arm 17 standing in readiness at the transferring position (see FIG. 16(j)).

The wafer hand 51a moves downward, so that fifty wafers W are retained in the wafer holding grooves (not shown), which are formed on the chucks 17a, 17b and spaced at regular intervals (L/2) (see FIG. 16(k)).

Thereafter, the wafers W on the chucks 17a, 17b are conveyed to the cleaning/drying block 4, where both cleaning and drying of the wafers W are performed as follows.

First, at the cleaning station 4a, the wafers W are delivered to the wafer holding part 102 of the first transfer device 23. Then, the support member 101 is lowered to submerge the wafers W in ammonia solution stored in the first chemical bath 109, thereby removing particles from the wafers W.

Next, the support member 101 of the first transfer device 23 raises, and further moves horizontally to a position above the first water-cleaning bath 20. The support member 101 is lowered to submerge the wafers W, retained on the wafer holding part 102, into pure water stored in the water-cleaning bath 20. Then the wafers W subjected to water cleaning while the pure water is overflowing from the bath 20.

After cleaning the wafers W, they are removed from the water-cleaning 20, and are delivered to the chucks 17a, 17b of the transfer arm 17.

Subsequently, at the position above the second chemical bath 21, the transfer arm 17 delivers the wafers W to the wafer holding part 102 of the second transfer device 24. Then, the support member 101 of the second transfer device 24 descends to submerge the wafers W in an etching liquid, dilute fluoride acid for example, stored in the second chemical bath 21. As a result, oxide film formed on the wafers W, for example, $SiO_2$-film is etched to reduce a thickness thereof.

Next, the support member 101 raises to remove the wafers W from the etching liquid stored in the second chemical bath 21, and further moves horizontally to a position right above the second water-cleaning bath 22. Thereafter, the support member 101 is lowered to submerge the wafers W, retained on the wafer holding part 102, into pure water stored in the water-cleaning bath 22. Then the wafers W subjected to water cleaning while the pure water is overflowing from the bath 22. In this way, the etching process is completed.

After completion of the etching process, the wafers W are transferred from the wafer holding part 102 to the chucks 17a, 17b of the transfer arm 17. After receiving the wafers W, the transfer arm 17 travels on the guide 18 to the drying station 4b, where the wafers W are delivered to the transfer device 26.

At the drying station 4b, the wafers W are subjected to pure-water cleaning in the water-cleaning bath 25, thereafter, they are removed from the water-cleaning bath 25 and moved into the drying chamber located above the water-cleaning bath 25. Thereafter, IPA vapor is fed to the wafers W held by the transfer device 26. Pure water remaining on the wafers W is replaced with IPA, and thus the wafers W are dried.

After completion of the cleaning and drying process, the processed wafers W are delivered to the chucks 17a, 17b of the transfer arm 17. After receiving the wafers W, the transfer arm 17 travels on the guide 18 to move to the wafer conveying/arraying station 6 of the loading/unloading and conveying block 2. Then, at the wafer loading/unloading and arraying device 14, the wafer hand 51b receives the cleaned and dried (processed) wafers W retained by the chucks 17a, 17b of the transfer arm 17.

The wafer holding members 65a, 65b of the pitch changer 60, which are positioned below the wafers W retained on the wafer hand 51b, then moves upward. Thereupon, half the number of the wafers W (twenty-five wafers) retained on the wafer hand 51b are transferred to the wafer holding members 65a, 65b and are retained in the wafer holding grooves 67a, 67b spaced at regular intervals (L). The other half of the wafers W (twenty-five wafers) are pass through the slits 69a, 69b, and remains on the wafer hand 51b.

The wafer hand 51b is lowered to pass through an empty carrier C placed on the carrier mounting port 35 of the wafer loading/unloading stage 34. Thereupon, twenty-five wafers W are accommodated in the carrier C. This carrier C is conveyed to the unloading stage 12 by the moving table 15.

Then, another empty carrier C is placed on the carrier mounting port 35 of the wafer loading/unloading stage 34. The wafer hand 51b receives twenty-five wafers W retained by the wafer holding members 65a, 65b and spaced at regular intervals (L). The wafers thus received by the wafer hand 51b are accommodated in the carrier C in the same manner, and the same carrier C is transported to the unloading stage 12 by the moving table 15.

Figure 17:
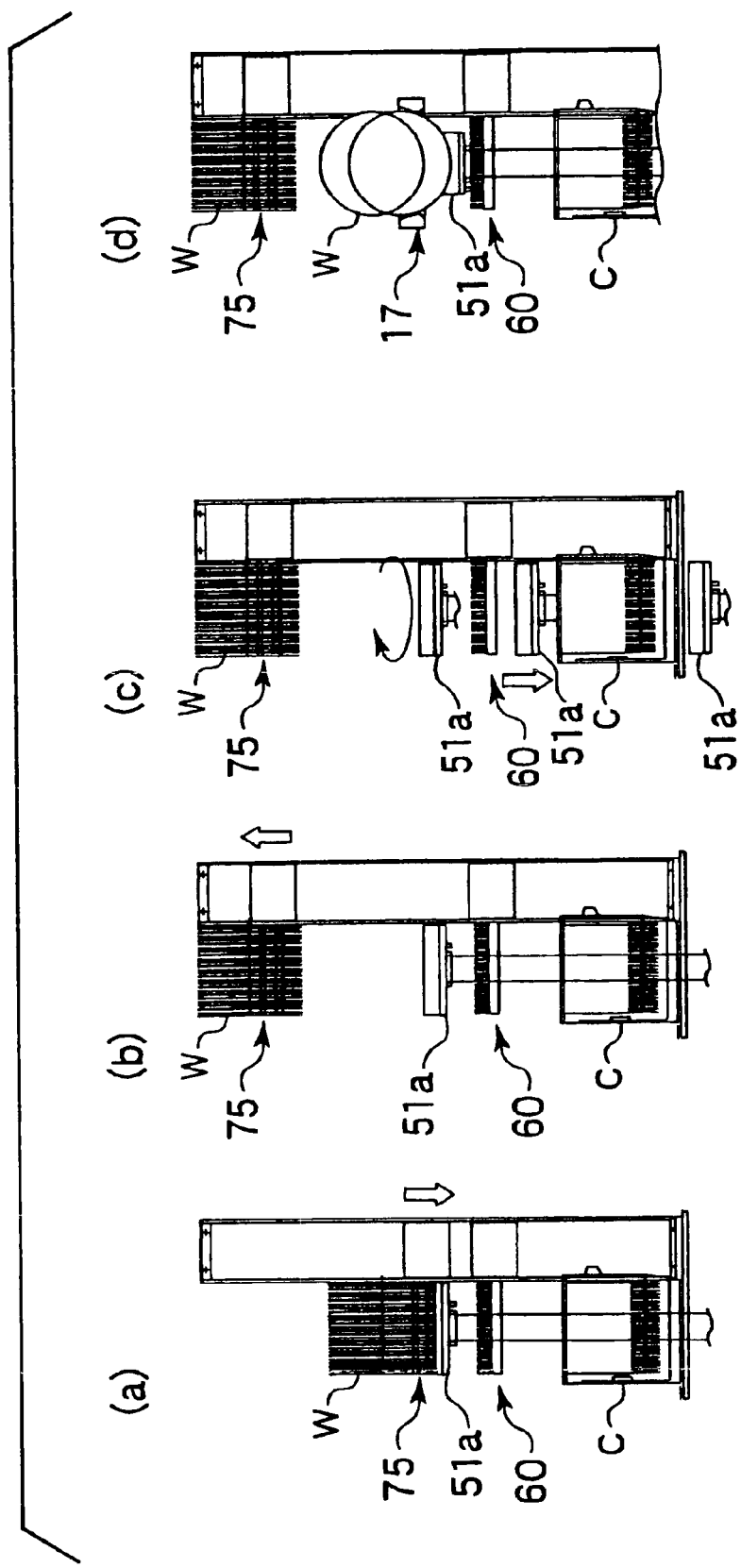
FIG. 17 is a view for explanation of steps executed in the wafer loading/unloading and arraying device, in the event that the timing of pitch-changing and conveying operations for the unprocessed wafers and those for the processed wafers overlaps.

In the event that an overlapping occurs in the timing of the conveying (by the transfer arm 17) and pitch-changing (by the pitch changer 60) operations for the processed wafers W and those operations for the unprocessed wafers W, the wafer loading/unloading and arraying device 14 and the wafer transfer arm 17 operate as follows. The operation of the device 14 and the arm 17 will be described with reference to FIG. 17.

After completion of the step shown in FIG. 16(i), the wafer holding members 75a, 75b (i.e., stand-by part 75) of the stand-by mechanism 70 is lowered. Then, fifty unprocessed wafers W retained on the wafer hand 51a are delivered to the wafer holding members 75a, 75b (see FIG. 17(a)).

Thereafter, the stand-by part 75 is raised (see FIG. 17(b)). The wafer hand 51a is rotated with an angle of 180 degrees in order to return to its original rotational position, and then is lowered to a position below the wafer loading/unloading stage 34 (see FIG. 17(c)).

Next, the transfer arm 17 conveys the cleaned and dried wafers W to the wafer loading/unloading and arraying device 14. Then, in this device 14, the wafer hand 51b receives the cleaned and dried wafers W supported by the chucks 17a, 17b of the transfer arm 17 (see FIG. 17(d)).

Fifty wafers W retained on the wafer hand 51b are accommodated into two carriers C, and the same carriers C are conveyed to the unloading stage 12 by the transfer table 15.

After the carriers C, each containing twenty-five processed wafers W, are sent out from the wafer loading/unloading and arraying device 14, then the unprocessed wafers W standing by at the stand-by part 75 are transferred to the wafer hand 51a. Subsequently, in the above-mentioned order, the transfer arm 17 conveys the wafers W to the cleaning/drying block 4 to clean and dry them.

The wafer loading/unloading and arraying device 14 and the transfer arm 17 are commonly used when loading and unloading the wafers W to and from the carrier C. Thus, pitch-changing and conveying operations for the processed wafers should have priority over those operations for the unprocessed wafers, in the event that the timing of the former and the latter operations overlaps. Accordingly, in the conventional processing apparatus without including the stand-by part 75, it is impossible to start the unloading the wafers W from the carrier C unless the conveying and pitch-changing operation for the processed wafers has been completed. Thus, the wafer hand 51a and the pitch changer 60 cannot be used effectively, even if they are unoccupied when the wafer transfer arm 17 is conveying the processed wafers. Moreover, when the unprocessed wafers W are subjected to pitch-changing operation after completion of the conveying and pitch-changing operation for the processed wafers W, there is a case that the transfer arm 17 is unoccupied, thus transfer arm 17 cannot be used effectively. Accordingly, the conventional apparatus had no choice but to prolong its throughput.

However, in the above embodiment according to the present invention, the wafer loading/unloading and arraying device 14 is provided with the stand-by part 75. Therefore, even if the aforementioned overlapping occurs, the device 14 can receive carriers C containing unprocessed wafers, array wafers by the wafer hand 51a and the pitch changer 60, and temporarily store unprocessed wafers at the stand-by part 75, while the transfer arm 17 operates for conveying processed wafers W. Thus, the wafer hand 51a and the pitch changer 60 can be used effectively.

In addition, the transfer arm 17 can start transportation of the unprocessed wafers W from the stand-by part 75 to the cleaning/drying block 4 immediately after the transfer arm 17 handles the processed wafers W. Thus, transfer arm 17 also can be used effectively. Accordingly, it is possible to improve the throughput of the apparatus.

Furthermore, since the stand-by part 75 is present in the wafer loading/unloading and arraying device 14 and is arranged right above the pitch changer 60, the following advantages are achieved. The provision of the stand-by part 75 does not have a serious influence on the installation of the apparatus in space. The transfer of the wafers between the stand-by part 75 and the pitch changer 60 can be performed quickly. The transfer of the wafers between the stand-by part 75 and the pitch changer 60 can be performed by using the wafer hands 51a, 51b, thus there is no need to provide another transferring device for transferring the wafers between the stand-by part 75 and the pitch changer 60.

In the event that the aforementioned overlapping does not occur, after storing unprocessed wafers in the stand-by part 75, the device 14 may receive two carriers C containing another set of unprocessed wafers W and carry out the pitch-changing operation for the wafers of said two carriers C, thereby improving the throughput of the apparatus.

In the aforementioned pitch-changing and conveying operations carried out by the wafer loading/unloading and arraying device 14 and the wafer transfer arm 17 controlled by the controller 7, when the wafer transfer arm 17 works in the cleaning/drying block 4, the device 14 receives unprocessed wafers W, executes the pitch-changing operation of the unprocessed wafers W, and stores the unprocessed wafers W in the stand-by part 75. Thereafter, the transfer arm 17 transports processed wafers W to the device 14.

However, upon comparing a time required to return the dried wafers W to the device 14 with a time required to convey the unprocessed wafers W into the first cleaning bath, the above processing sequence may be modified so as to give the shorter operation preference.

Next, cleaning apparatus 200, which is the second embodiment of the present invention will be described with reference to FIGS. 18 and 19.

The cleaning apparatus 200 is mainly composed of: a loading/unloading block 202 for loading/unloading and storing the carrier C; a cleaning/drying block 204 for cleaning and drying the wafers W; and an interface block 206 positioned between the loading/unloading block 202 and the cleaning/drying block 204 to perform transportation of the wafers W, adjustment in their positions, and change in their attitudes.

The cleaning/drying block 204 has a structure similar to that of the cleaning/drying block 4 of the first embodiment, and thus its detailed illustrations and descriptions are omitted.

The cleaning apparatus 200 handles carriers C, each of which accommodates prescribed number of (in this embodiment, twenty-five) wafers W and retains wafers W horizontally.

The loading/unloading block 202 includes a carrier loading/unloading part 205 and a carrier stocking part 206. The carrier loading/unloading part 205 is provided with a stage 211 for mounting the carriers C thereon. The carrier stocking part 206 is provided with a plurality of carrier holding members 213 for storing carriers C thereon.

The carrier C which contains wafers W (before cleaning) therein and is placed on the stage 211, is transferred to the carrier stocking part 206 by a carrier transfer mechanism 216.

The carrier C containing cleaned and dried wafers W is delivered from the carrier stocking part 206 to the stage 211 by the carrier transfer mechanism 211.

A shutter 214 is arranged between the carrier loading/unloading part 205 and the carrier stocking part 206. When transporting the carrier C between the carrier loading/unloading part 205 and the carrier stocking part 206, the shutter 214 is opened. Besides that, the shutter 214 is closed to separate the atmosphere in the carrier loading/unloading part 205 from that in the carrier stocking part 206.

Figure 18:
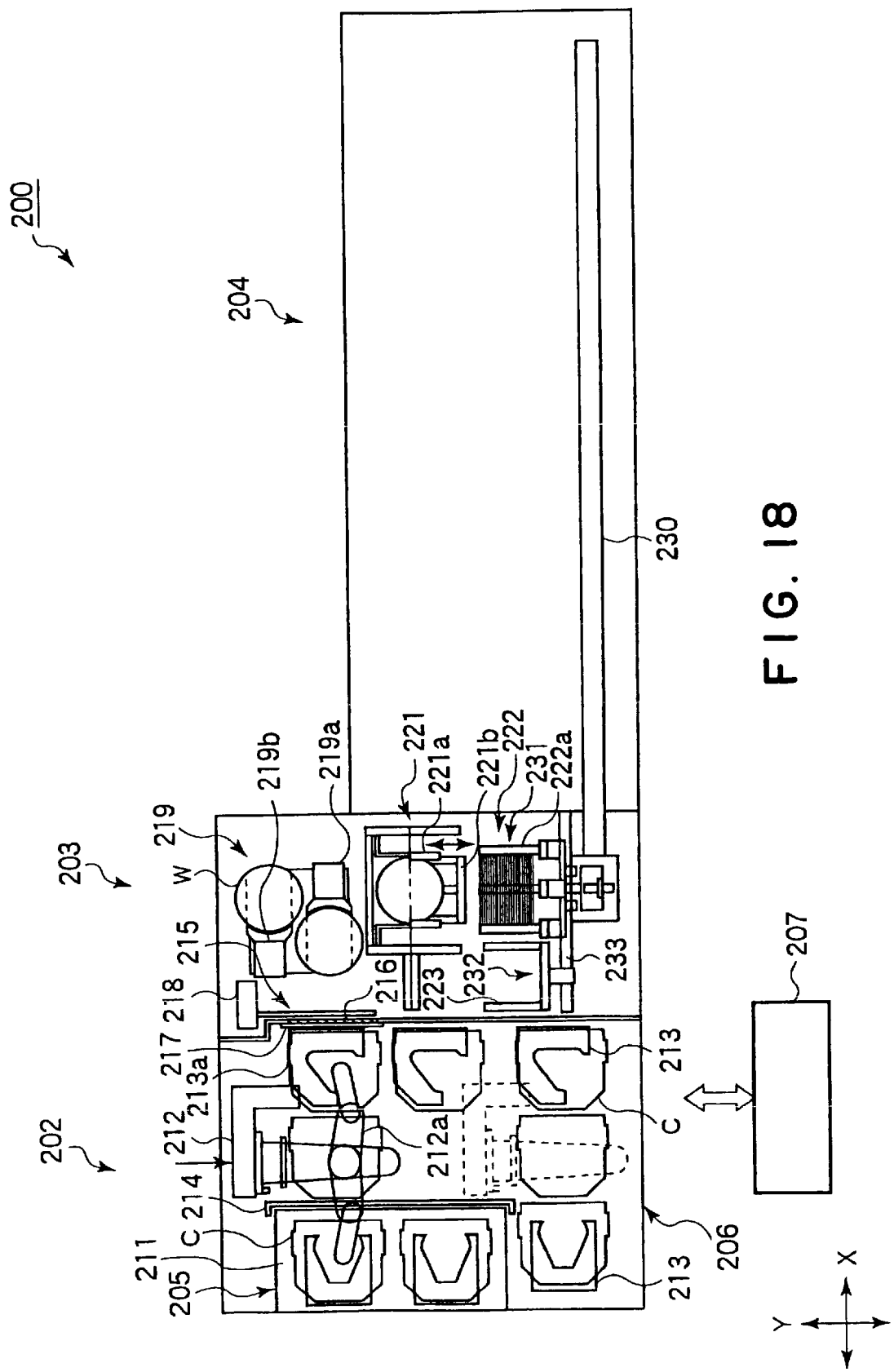
FIG. 18 is a plan view showing the cleaning apparatus in accordance with the second embodiment of the present invention.
Figure 19:
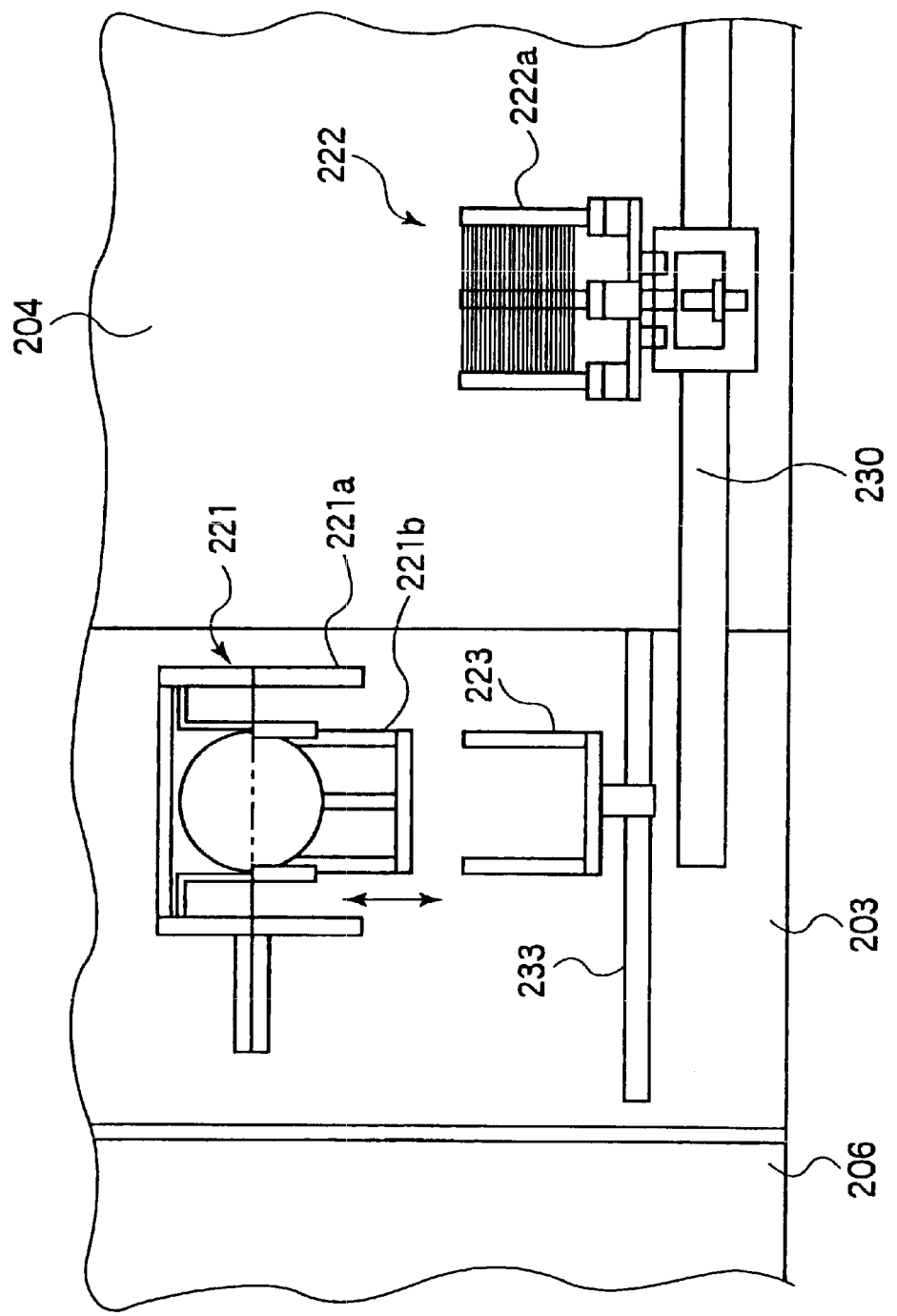
FIG. 19 is a view showing a state to transfer the wafers to a stand-by part of the cleaning apparatus in accordance with the second embodiment of the present invention.

The carrier transfer mechanism 212 has an arm 212a, such as multi-joint arm or expandable arm, which moves carrier C at least in X-direction of FIG. 18. The arm 212a holds and transports the carrier C. The carrier transfer mechanism 212 itself is capable of moving in both Y- and Z-direction by the drive mechanisms, not shown. Thus, the carrier transfer mechanism 212 can move the carrier C to placing it on any one of the carrier holding member 213.

The carrier holding members 213 are arranged, adjacent to walls defining the carrier stocking part 206, at four positions (including one position on the top of a wafer delivery part mentioned later). At each of the four positions, a plurality of (in this embodiment, four) carrier holding members 213 are provided and are piled up vertically. The carrier stocking part 206 (carrier holding members 213) temporarily stores empty carriers C, from which unprocessed wafers W are removed, and also stores empty carriers C for accommodating processed (cleaned) wafers W.

A window 216 is formed in a wall separating the carrier stocking part 206 and the interface block 203. The apparatus is provided with a wafer transfer part 215 about the window. The wafer transfer part 215 is provided, on the carrier stocking part 206 side, with a carrier holding member 213a, which allows the carrier C to be mounted in a manner that a lid of the carrier C faces the window 216.

The wafer transfer part 215 is provided with a lid opening mechanism 217, which closes and opens of the lid of the carrier C mounted on the carrier holding member 213a, on the carrier stocking part 206 side or the interface block 203 side. The opening of the window 216 and the lid allows the wafers W to be transferred from the carrier C to the interface block 203 side, and vice versa.

On the interface block 203 side of the wafer transfer part 215, a sensor mechanism 218 is arranged to count the number of wafers W in the carrier C. In detail, the sensor mechanism 218 detects the number of wafers W and also the wafers' condition in the carrier while an optical sensor head scans the carrier in Z-direction.

The interface block 203 includes a wafer transfer mechanism 219, an attitude changing and arraying device 221, a transfer device 222, and stand-by part 223.

The wafer transfer mechanism 219 removes the wafers W from the carrier C through the window 216, and also moves the cleaned wafers W into the carrier C. The attitude changing and arraying device 221 receives the wafers contained in two carriers from the transfer mechanism 219, and changes the attitude of the wafers thus received and arrays them.

The transfer device 222 delivers and receives the wafers W to and from the device 221. The device 222 moves along a guide 230 extending in the longitudinal direction of the cleaning/drying block 204, in order to transports the wafers W between a transfer position (where wafers W are transferred between the devices 221, 222) and processing baths arranged in the block 204.

The stand-by part 223 temporarily stores the wafers W, which have been changed in their attitude and arrayed by the device 221.

The wafer transfer mechanism 219 has a first transfer arm 219a for handling unprocessed wafers W and a second transfer arm 219b for handling processed (cleaned and dried) wafers W. The wafer transfer mechanism 219 can rotate, as a whole, about a vertical axis. Both of the arms 219a, 219b are capable of linear movement. Each of the arms 219a, 219b is equipped with a plurality of wafer holding members, and thus is capable of holding a plurality of wafers W collectively and horizontally.

When removing unprocessed wafers W from the carrier C placed on the carrier holding member 213a, the wafer transfer mechanism 219 is set so that the moving direction of the arm 219a coincides with X-direction and the arm 219a is located adjacent to the attitude changing and arraying device 221, as shown in FIG. 18. Then, the arm 219a is inserted into the carrier C to removes the wafers W therefrom.

Next, the wafer transfer mechanism 219 is rotated in a counter-clockwise direction at an angle of 90 degrees so that the moving directions of the arm 219a coincides with Y-direction and the arm 219a is located adjacent to the cleaning/drying block 204. The arm 219a moves in Y-direction to deliver the wafers W to the attitude changing and arraying device 221.

When receiving processed wafers W from the attitude changing and arraying device 221, the wafer transfer mechanism 219 is set so that the moving direction of the arms 219b coincides with Y-direction and the arm 219b is located adjacent to the cleaning/drying block 204. The arm 219b moves in Y-direction to receive the processed wafers W from the attitude changing and arraying device 221.

Then, the wafer transfer mechanism 219 is rotated in a clockwise direction at an angle of 90 degrees so that the moving directions of the arm 219b coincides with Y-direction and the arm 219b is located adjacent to the attitude changing and arraying device 221. The arm 219b moves in Y-direction to accommodate the processed wafers W into the empty carrier C placed on the carrier holding member 213a.

When the wafer transfer mechanism 219 transfers the wafers W, each of the wafers W is in a horizontal attitude. However, when cleaning the wafers W, each of them must be in a vertical attitude. Therefore, the attitudes of the wafers W are changed in the attitude changing and arraying device 221.

The attitude changing and arraying device 221 has a wafer holding part 221a and a pitch changer 221b arranged below the holding part 221a. The wafer holding part 221a is capable of holding twenty-five wafers W and is also rotatable with an angle of 90 degrees. The pitch changer 221b is capable of holding fifty wafers W, with the wafers W being spaced apart at regular intervals (L/2). In other words, the attitude changing and arraying device 221 arranges fifty wafers W in a horizontal direction and in vertical attitudes, with the wafers W being spaced apart at regular intervals (L/2), which are half of the size of the intervals (L) that exist when the wafers are held in the wafer carriers C. The pitch changer 221b is movable between a position just below the holding part 221a and a transfer position 231 described later.

In the attitude changing and arraying device 221, twenty-five wafers W, which are removed from first carrier C by the wafer transfer mechanism 219, is received by the holding part 221a. The holding part 221a holding the wafers W rotates with an angle of 90 degrees, so that they are arranged in a horizontal direction and in vertical attitudes.

Thereafter, the pitch changer 221b positioned below the holding part 221a is elevated to retain thereon twenty-five wafers W, which are spaced at regular intervals (L).

Next, twenty-five wafers W, which are removed from the second carrier C by the wafer transfer mechanism 219, is received by the holding part 221a. The attitudes of the wafers W also changed in the same manner as above.

Then, the pitch changer 221b is shifted in the arraying direction of the wafers W by a distance of L/2, and raised to insert the latter twenty-five wafers W between adjacent ones of the former twenty-five wafers W, having already been retained on the pitch changer 221b. Consequently, fifty wafers W are retained on the pitch changer 221b, and are spaced at regular intervals (L/2).

The transfer device 222 is equipped with a wafer chuck 222a for holding wafers W thereon, and transports the wafers W along the guide 230. At the transfer position 231, the wafers W, which are arranged in a horizontal direction and in vertical attitudes, are transferred between the transfer device 222 and the pitch changer 221b.

When delivering wafers W from the pitch changer 221b to the transfer device 222, the chuck 222a is set to be its non-holding state. Then, the pitch changer 221b positioned at the transfer position 231 and retaining fifty wafers W is raised to be located above the chuck 222a. Next, the chuck 222a is set to be its holding state, and then the pitch changer 221b is lowered to deliver fifty wafers W to the chuck 222a. As a matter of course, the wafers W are also spaced at regular intervals L/2 when they held by the chuck 222a.

The stand-by part 223 is capable of horizontal movement, along the guide 233, between a transfer position 231 and a stand-by position 232. The stand-by part 223 receives fifty wafers W, which have been arrayed by the pitch changer 221b of the device 221, at the transfer position 231, and then moves to the stand-by position in order to stand by for transportation to the cleaning/drying block 204.

The operations of the cleaning apparatus 200, which is controlled by a controller 207, will be described.

Two carriers C (each containing twenty-five wafers or a total of fifty wafers W, i.e., one "lot" of wafers W to be processed at one time) are mounted on the carrier loading/unloading part 205. Next, the shutter 214 is opened and the first carrier C is loaded into the carrier stocking part 206 by the carrier transfer mechanism 212. After loading the first carrier C into the carrier stocking part 206, then the shutter 214 is closed. In the carrier stocking part 206, the carrier C is mounted on the carrier holding member 213a arranged in the wafer transfer part 215. After the lid of the carrier C is opened by the lid opening mechanism 217 and continuously the window 216 is opened, the sensor mechanism 218 inspects the number of wafers W and their conditions of accommodations in the carrier C.

If the sensor mechanism 218 detects no abnormality, the window 216 and the lid of the carrier C are closed. Then, the carrier C removed from the carrier holding member 213a in order to be placed on one of the carrier holding members 213 in the carrier stocking part 206.

Subsequently, the second carrier C is subjected to the inspection by the sensor mechanism 218. If the sensor mechanism 218 detects no abnormality, the same carrier is also placed on one of the carrier holding members 213 in the carrier stocking part 206.

The aforementioned operations is executed repeatedly until required number of carriers C containing wafers W are stored in the carrier stocking part 206.

Next, the first carrier C of the first lot is moved from the carrier stocking part 206 to the carrier holding member 213a at the wafer transfer part 215. Then, the lid of the carrier C and the window 216 are opened. The arm 219a for the unprocessed wafers of the wafer transfer mechanism 219 picks up twenty-five wafers W from the first carrier C and transports them to the attitude changing and arraying device 221.

In the same device 221, the holding part 221a carries twenty-five wafers W, and is rotated with an angle of 90 degrees so that the wafers W are in vertical attitudes. These twenty-five wafers W are delivered to the pitch changer 221b.

Thereafter, the window 216 is closed, and the lid is fitted to the emptied carrier C. The same carrier C is returned, from the wafer transfer part 215, to its original position in the carrier stocking part 206.

Then, the second carrier C is moved to the wafer transfer part 215, where the arm 219a of the wafer transfer mechanism 219 picks up the wafers W from the carrier C and transfers the wafers W to the device 221. In the same device 221, the holding part 221a carries twenty-five wafers W, and is rotated with an angle of 90 degrees so that the wafers W is in vertical attitudes.

Next, upon shifting the pitch changer 221b by a distance L/2 in the arraying direction of the wafers W, the next twenty-five wafers are inserted between the wafers W already retained on the pitch changer 221b.

Consequently, fifty wafers W are arranged on the pitch changer 221b, being spaced at regular intervals L/2. With the movement of the pitch changer 221b to the transfer position 231, the wafers W thus arrayed are transferred from the pitch changer 221b onto the chuck 222a of the transporting device 222. The wafers W are transported to the cleaning/drying block 204 for designated cleaning process.

After completion of the designated cleaning process and the sequent drying process, the transfer device 222 moves the processed wafers W to the transfer position 231 of the device 221 to return the attitudes of the wafers W. Fifty wafers W are returned to two carriers twenty-five by twenty-five.

The above operations are repeated until all of the wafers W contained in carriers C stored in the carrier stocking part 206 are processed.

In this processing apparatus 200, the wafer the attitude changing and arraying device 221 and the transfer device 222 are commonly used for handling both processed wafers W and unprocessed wafers W.

Thus, pitch-changing, attitude-changing and conveying operations for the processed wafers W should have priority over those operations for the unprocessed wafers W, in the event that the timing of the former and the latter operations overlaps.

Accordingly, in the conventional processing apparatus without including the stand-by part 223, it is impossible to start the pitch-changing, attitude-changing and conveying operations for the unprocessed wafers W, unless the those operations for the processed wafers W has been completed. Thus improvement of throughput cannot be achieved.

However, in the above embodiment according to the present invention, the stand-by part 223 is provided adjacent to the attitude changing and arraying device 221. In the event that the timing of the pitch-changing, attitude-changing and conveying operations for the unprocessed wafers W and those operations for the processed wafers W overlaps, the unprocessed wafers W can be subjected to the pitch-changing and attitude-changing operations and be temporarily stored in the stand-by part 223, while the transfer device 222 are handling the processed wafers W. Thus, the unprocessed wafers can be transported to the cleaning/drying block 204 immediately after the processed wafers are transferred from the transfer device 222 to the attitude changing and arraying device 221. Thus, improvement of throughput can be achieved.

It should be noted that the present invention is not restricted to the above-mentioned two embodiments.

Although the substrate processing apparatus (1, 200) is provided with only one stand-by part (75, 223) in common with the above-mentioned embodiments, there may be provided a plurality of stand-by parts. For example, as shown in FIG. 7A, the support member 72 may be provided with a plurality of stand-by parts 75. In this case, the support member 72 is composed of an elevating member 72a capable of vertical movement along the guide member 61 and a rotating member 72b arranged around the elevating member 72a and rotatable about a vertical axis. The stand-by parts 75, 75 are opposite to each other across the guide member 61. With the rotation of the rotating member 72b by a not-shown motor, each stand-by part 75 can occupy a first position right above the pitch changer 60 and a second position moved at an angle of 180 degrees with the first position. According to the structure of FIG. 7A, more wafers W may be temporarily stored in comparison with the structure of FIG. 7.

Similarly, the apparatus may be provided, right above (or below) the stand-by part 223 and the guide 233, with an additional stand-by part 223 and an additional guide 233 of the same structures.

In the above embodiments, the wafers of two carriers are subjected to the pitch-changing operation, and thereafter are subjected to the cleaning process. However, in the event that the pitch changer is not provided in the apparatus, improvement of the throughput is achieved by providing the stand-by part.

Although the apparatus may include liquid processing units other than chemical cleaning units and pure wafer cleaning units, which are shown in the above embodiments. Processing units without using a treatment liquid may be provided in the apparatus instead of the liquid processing units.

The substrate to be processed in the processing apparatus may be glass substrates for liquid crystal display (LCD) units, or the like, instead of semiconductor wafer.

What is claimed is:

1. A substrate processing method comprising the steps of:
   removing a first group of substrates to be processed from two containers, in which substrates spaced at first regular intervals are contained;
   arranging, at a substrate arraying part, the first group of substrates thus removed from said two containers, so that the substrates of the first group are spaced at second regular intervals, which are half of the size of the first regular intervals;
   moving the first group of substrates thus arranged to a substrate stand-by part so as to empty the substrate arraying part;
   making the first group of substrates thus moved to the substrate stand-by part temporarily and collectively stand by at the substrate stand-by part for transportation to a processing part;
   conveying a second group of substrates, having been processed at the processing part, from the processing part to the emptied substrate arraying part, while the first group of substrates are kept standing by at the substrate stand-by part for transportation to the processing part;

arranging, at the substrate arraying part, the second group of substrates so that the second group of substrates are spaced at the first regular intervals;

accommodating the second group of substrates thus arranged into two containers; and conveying the first group of substrates, which are standing by at the substrate stand-by part for transportation, to the processing part.

2. A substrate processing system that removes substrates from a substrate container, changes a substrate arrangement condition between a first condition corresponding to an arrangement of the substrates in the container and a second condition after removing the substrates from the substrate container and processes the substrates, said system comprising:

a processing unit adapted to process substrates collectively;

an apparatus adapted to house and remove substrates to and from a substrate container collectively and also adapted to perform at least one arranging operation by which the substrate arrangement condition is changed between the first condition and the second condition; and a substrate transfer arm adapted to convey substrates arranged in the second condition between the apparatus and the processing unit, wherein said system further includes a first substrate holder, arranged adjacent to the apparatus, that temporarily holds a first group of substrates which are received from the apparatus, arranged in the second condition and to be processed by the processing unit, while allowing the substrate transfer arm, holding a second group of substrates processed by the processing unit, to deliver the second group of substrates to the apparatus.

3. The substrate processing system according to claim 2, wherein the first substrate holder is adapted to move between a first position, where substrates arranged in the second condition are transferred between the substrate transfer arm and the first substrate holder and also where substrates arranged in the second condition are transferred between the substrate transfer arm and the apparatus, and a second position adjacent to the first position where no interference between the substrate transfer arm and the first substrate holder occurs.

4. The substrate processing system according to claim 3, wherein the first substrate holder is mounted to a guide rail so as to be horizontally movable between the first and the second positions.

5. The substrate processing system according to claim 2, wherein the apparatus includes:

an arranging unit configured to perform an attitude-changing operation as the arranging operation by which the substrate arrangement condition is changed between the first condition in which substrates lying horizontally are arrayed vertically and the second condition in which substrates standing up vertically are arrayed horizontally; and a substrate hand adapted to house and remove substrates arranged in the first condition to and from a substrate container collectively, and also adapted to access the arranging unit to transfer substrates to and from the arranging unit, and wherein the substrate transfer arm is adapted to access the arranging unit to transfer substrates arranged in the second condition between the arranging unit and the substrate transfer arm.

6. The substrate processing system according to claim 5, wherein the first substrate holder is adapted to move between a first position, where substrates arranged in the second condition are transferred between the substrate transfer arm and the first substrate holder and also where substrates arranged in the second condition are transferred between the substrate transfer arm and the apparatus, and a second position adjacent to the first position where no interference between the substrate transfer arm and the first substrate holder occurs.

7. The substrate processing system according to claim 2, wherein the apparatus includes:

an arranging unit configured to perform an attitude-changing and pitch-changing operations as the arranging operation by which the substrate arrangement condition is changed between the first condition in which substrates lying horizontally are arrayed vertically at first intervals and the second condition in which substrates standing up vertically are arrayed horizontally at second intervals; and a substrate hand adapted to house and remove substrates arranged in the first condition to and from a substrate container collectively, and also adapted to access the arranging unit to transfer substrates to and from the arranging unit, and wherein the substrate transfer arm is adapted to access the arranging unit to transfer substrates arranged in the second condition between the arranging unit and the substrate transfer arm.

8. The substrate processing system according to claim 7, wherein the first substrate holder is adapted to move between a first position, where substrates arranged in the second condition are transferred between the substrate transfer arm and the first substrate holder and also where substrates arranged in the second condition are transferred between the substrate transfer arm and the apparatus, and a second position adjacent to the first position where no interference between the substrate transfer arm and the first substrate holder occurs.

9. The substrate processing system according to claim 2, wherein the apparatus includes:

a second substrate holder arranged below the first substrate holder and adapted to hold substrates; and a substrate hand adapted to house and remove substrates to and from a substrate container collectively, adapted to access the second substrate holder to transfer substrates arranged in the first condition to and from the second substrate holder, and adapted to access the first substrate holder to transfer substrates arranged in the second condition to and from the first substrate holder.

10. The substrate processing system according to claim 9, wherein the substrate transfer arm is adapted to access the substrate hand to transfer substrates arranged in the second condition to and from the substrate hand.

11. A substrate processing system comprising:

a processing unit adapted to process substrates collectively;

a pitch-changing apparatus adapted to perform a pitch-changing operation by which a substrate arrangement condition is changed between a first condition in which substrates are arrayed at first intervals and a second condition in which substrates are arrayed at second intervals, the pitch-changing apparatus including a first substrate holder adapted to hold substrates removed from a substrate container, and a substrate hand adapted to remove substrates arranged in the first condition from a substrate container collectively and adapted to house substrates into a substrate container collectively, the substrate hand being adapted to access the first substrate holder to transfer substrates arranged in the first condition to and from the first substrate holder;

a substrate transfer arm adapted to convey substrates arranged in the second condition between the pitch-changing apparatus and the processing unit; and a second substrate holder adapted to temporarily hold substrates arranged in the second condition, wherein the substrate hand is also adapted to access the second substrate holder to transfer substrates arranged in the second condition between the pitch-changing apparatus and the second substrate holder.

12. The substrate processing system according to claim 11, wherein the substrate transfer arm is adapted to access the substrate hand to transfer substrates arranged in the second condition to and from the substrate hand.

13. The substrate processing system according to claim 12, wherein:

the substrate hand comprises a push-up member adapted to push up substrates to be removed from a substrate container, the push-up member having a plurality of holding recesses each adapted to hold the periphery of a substrate, and the holding recesses number 2N and are arranged horizontally at the second intervals, where N is a natural number and the second intervals are half of the size of the first intervals;

the first substrate holder has a plurality of holding grooves each adapted to hold a periphery of a substrate and a plurality of slits configured so that substrates held by the substrate hand can pass through the slits vertically, the holding grooves number N and are horizontally arranged at the first intervals, the slits number N and are arranged horizontally at the first intervals, and the holding grooves and the slits are alternately arranged at the second intervals; and the substrate hand is adapted to move vertically;

wherein a first group of substrates that number N and a second group of substrates that number N can be alternately arranged on the push-up member at the second intervals by vertically passing the push-up member holding the first group of substrates in every other holding recess through the first substrate holder holding the second group of substrates in the holding grooves.

14. The substrate processing apparatus according to claim 11, wherein the substrate hand is adapted to move vertically, and the second substrate holder is arranged right above the first substrate holder.

15. The substrate processing apparatus according to claim 11, wherein the first and the second substrate holders are mounted to a guide rail so as to be vertically movable while being guided by the guide rail.

* * * * *